US010886909B2

(12) United States Patent
Baburske et al.

(10) Patent No.: US 10,886,909 B2
(45) Date of Patent: Jan. 5, 2021

(54) ELECTRIC ASSEMBLY INCLUDING AN INSULATED GATE BIPOLAR TRANSISTOR DEVICE AND A WIDE-BANDGAP TRANSISTOR DEVICE

(71) Applicant: Infineon Technologies AG, Neubiberg (DE)

(72) Inventors: Roman Baburske, Otterfing (DE); Johannes Georg Laven, Taufkirchen (DE); Thomas Basler, Riemerling (DE)

(73) Assignee: Infineon Technologies AG, Neubiberg (DE)

( * ) Notice: Subject to any disclaimer, the term of this patent is extended or adjusted under 35 U.S.C. 154(b) by 635 days.

(21) Appl. No.: 15/620,861

(22) Filed: Jun. 13, 2017

(65) Prior Publication Data

US 2017/0366180 A1    Dec. 21, 2017

(30) Foreign Application Priority Data

Jun. 17, 2016    (DE) .................. 10 2016 111 127

(51) Int. Cl.
*H03K 17/00* (2006.01)
*H03K 17/082* (2006.01)
(Continued)

(52) U.S. Cl.
CPC ..... *H03K 17/0826* (2013.01); *H01L 21/8213* (2013.01); *H01L 27/0629* (2013.01);
(Continued)

(58) Field of Classification Search
CPC ............... H03K 17/0826; H03K 17/28; H01L 21/8213; H01L 27/0629; H01L 27/0664;
(Continued)

(56) References Cited

U.S. PATENT DOCUMENTS 6,462,962 B1 * 10/2002 Cuk .................. H02M 3/33538
                                                        363/16
7,141,958 B2 * 11/2006 Saitoh ..................... H02M 1/36
                                                        323/299
(Continued)

FOREIGN PATENT DOCUMENTS

DE    102014118208 A1    6/2015
DE    102014108451 B3    8/2015
(Continued)

OTHER PUBLICATIONS

Kaerst, Jens P. et al., "High Frequency Power Switch—Improved Performance by MOSFETs and IGBTs Connected in Parallel", IEEE European Conference on Power Electronics and Applications, Sep. 2005, pp. 1-11.

(Continued)

*Primary Examiner* — Pete T Lee
(74) *Attorney, Agent, or Firm* — Murphy, Bilak & Homiller, PLLC

(57) ABSTRACT

An electric assembly includes an insulated gate bipolar transistor device, a wide-bandgap transistor device electrically connected in parallel with the bipolar transistor device and a control circuit. The control circuit is electrically coupled to a gate terminal of the bipolar transistor device and to a control terminal of the wide-bandgap transistor device. The control circuit is configured to turn on the bipolar transistor device and to turn on the wide-bandgap transistor device at a predefined turn-on delay with respect to a turn-on of the bipolar transistor device.

28 Claims, 17 Drawing Sheets

(51) Int. Cl.
- *H03K 17/28* (2006.01)
- *H01L 27/088* (2006.01)
- *H01L 21/82* (2006.01)
- *H01L 29/08* (2006.01)
- *H01L 27/06* (2006.01)
- *H01L 29/06* (2006.01)
- *H01L 29/10* (2006.01)
- *H01L 29/16* (2006.01)
- *H01L 29/739* (2006.01)
- *H01L 29/78* (2006.01)
- *H01L 29/808* (2006.01)
- *H01L 21/8234* (2006.01)
- *H01L 29/04* (2006.01)

(52) U.S. Cl.
CPC ........ *H01L 27/0664* (2013.01); *H01L 27/088* (2013.01); *H01L 29/0696* (2013.01); *H01L 29/0834* (2013.01); *H01L 29/1095* (2013.01); *H01L 29/1608* (2013.01); *H01L 29/7395* (2013.01); *H01L 29/7805* (2013.01); *H01L 29/7815* (2013.01); *H01L 29/8083* (2013.01); *H03K 17/28* (2013.01); *H01L 21/823418* (2013.01); *H01L 21/823487* (2013.01); *H01L 29/045* (2013.01); *H01L 29/7802* (2013.01)

(58) Field of Classification Search
CPC ............... H01L 27/088; H01L 29/0696; H01L 29/0834; H01L 29/1095; H01L 29/7395; H01L 29/7805; H01L 29/7815; H01L 29/8083; H01L 21/823418; H01L 21/823487; H01L 29/045; H01L 29/7802
See application file for complete search history.

(56) References Cited

U.S. PATENT DOCUMENTS

| 7,782,027 B2 * | 8/2010 | Williams ............ H02M 3/1588 |
| | | 323/266 |
| 8,830,711 B2 | 9/2014 | Lai et al. |
| 2011/0180902 A1 | 7/2011 | Inagawa |
| 2015/0010931 A1 | 1/2015 | Oyler et al. |
| 2016/0344302 A1 * | 11/2016 | Inoue .................... H02M 7/219 |

FOREIGN PATENT DOCUMENTS

| DE | 102014111981 A1 | 2/2016 |
| WO | 2016000840 A1 | 1/2016 |

OTHER PUBLICATIONS

Ortiz, Gabriel et al., "Modeling of Soft-Switching Losses of IGBTs in High-Power High-Efficiency Dual-Active-Bridge DC/DC Converters", IEEE Transactions on Electron Devices, vol. 60, No. 2, Feb. 2013, pp. 587-597.

Song, Xiaoqing et al., "6.5kV FREEDM-Pair: Ideal High Power Switch Capitalizing on Si and SiC", IEEE 17th European Conference on Power Electronics and Applications, Oct. 29, 2015, pp. 1-9.

* cited by examiner

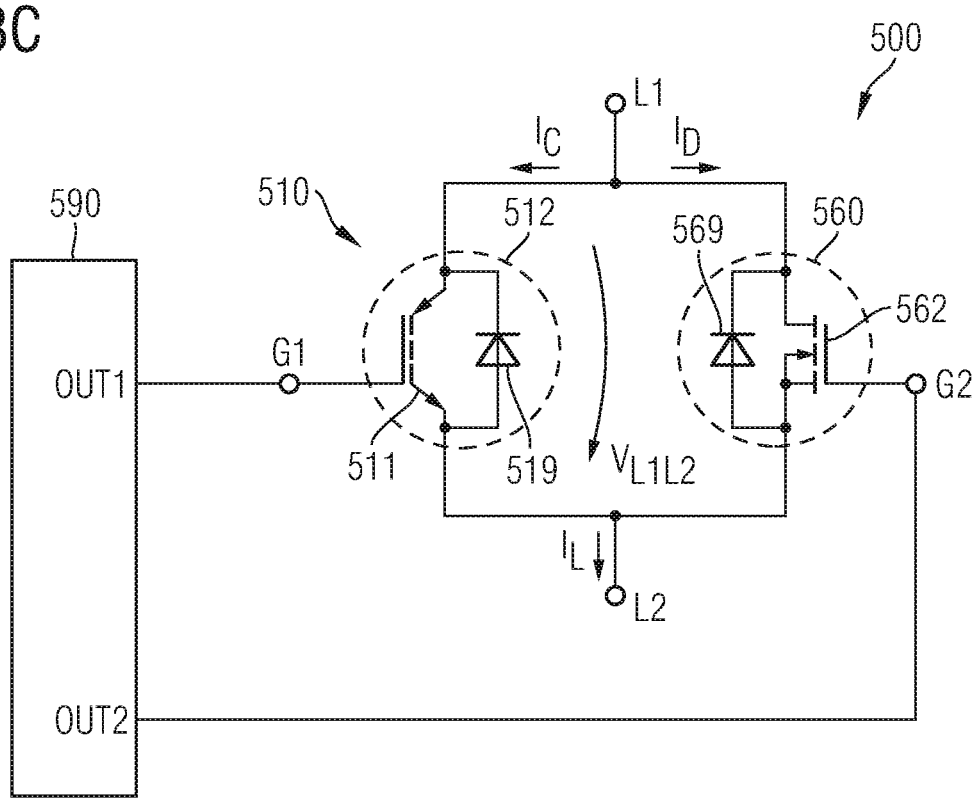

ELECTRIC ASSEMBLY INCLUDING AN INSULATED GATE BIPOLAR TRANSISTOR DEVICE AND A WIDE-BANDGAP TRANSISTOR DEVICE

BACKGROUND

IGBTs (insulated gate bipolar transistors) combine an IGFET (insulated gate field effect transistor) with an intrinsic bipolar junction transistor, wherein the IGFET turns off and on the bipolar junction transistor. Under forward bias IGBTs combine the input characteristics of unipolar IGFETs with the high current and low saturation voltage capability of a bipolar junction transistor. Device characteristics of IGBTs are a trade-off among constraints such as on-state resistance, reverse recovery charge, avalanche ruggedness, short-circuit ruggedness, manufacturing yield and costs.

It is desirable that electric assemblies get the benefit of the device characteristics of IGBTs at low costs.

SUMMARY

According to an embodiment an electric assembly includes an insulated gate bipolar transistor device and a wide-bandgap transistor device electrically connected in parallel with the bipolar transistor device. A control circuit is electrically coupled to a gate terminal of the bipolar transistor device and to a control terminal of the wide-bandgap transistor device. The control circuit is configured to turn on the bipolar transistor device and to turn on the wide-bandgap transistor device at a predefined turn-on delay with respect to a turn-on of the bipolar transistor device.

According to another embodiment an electric assembly, includes an insulated gate bipolar transistor device and a wide-bandgap transistor device electrically connected in parallel with the bipolar transistor device. The wide-bandgap transistor device includes a plurality of field effect transistor cells that are electrically connected in parallel. The wide-bandgap transistor device further includes a backside construction, which directly adjoins a drain electrode and which includes one or more backside pn junctions.

According to another embodiment an electric assembly includes a reverse conducting insulated gate bipolar transistor device that includes desaturation transistor cells. A wide-bandgap transistor device is electrically connected in parallel with the bipolar transistor device. A control circuit is electrically coupled to a gate terminal of the bipolar transistor device and to a control terminal of the wide-bandgap transistor device. The control circuit is configured to turn on the desaturation transistor cells under reverse bias of the bipolar transistor device and to turn on both the bipolar transistor device and the wide-bandgap transistor device under forward bias of the bipolar transistor device.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3C is a schematic circuit diagram of an electric assembly according to an embodiment including an IGFET with body diode.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
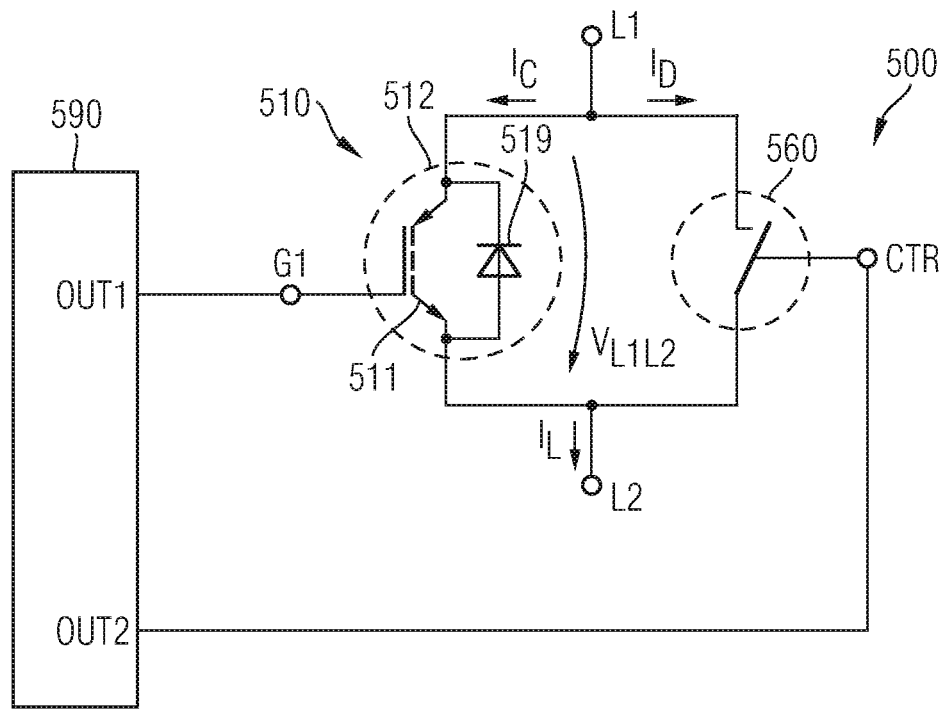
FIG. 1A is a schematic circuit diagram of an electric assembly including a bipolar transistor device, a wide-bandgap transistor device electrically connected in parallel with the bipolar transistor device and a control circuit electrically coupled to a gate terminal of the bipolar transistor device and to a control terminal of the wide-bandgap transistor device according to an embodiment.
Figure 1B:
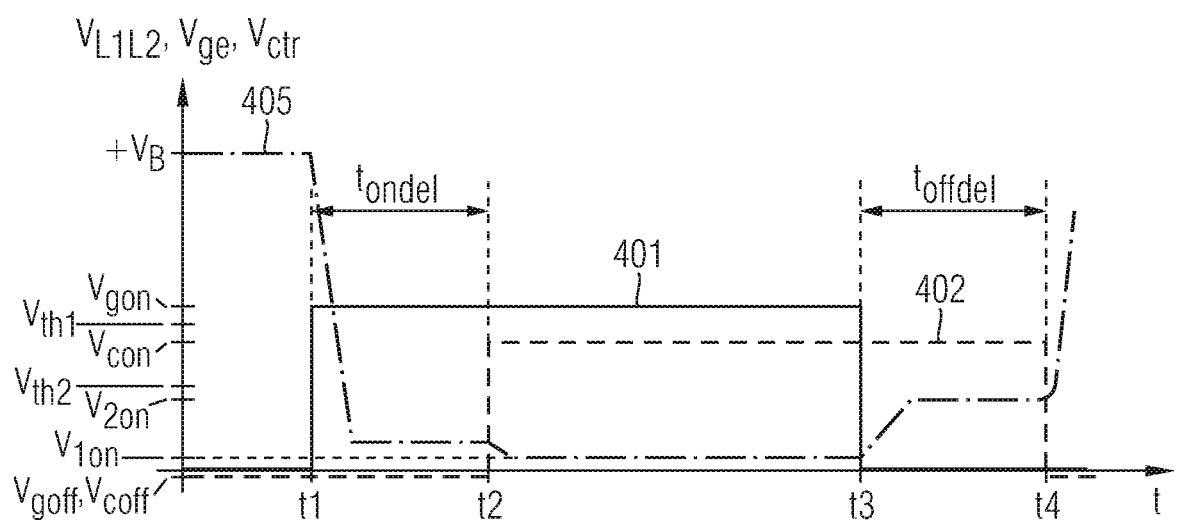
FIG. 1B is a schematic time chart illustrating control signals at the gate terminal of the bipolar transistor device and at the control terminal of the wide-bandgap transistor device of FIG. 1A according to an embodiment with the wide-bandgap transistor device turned on at a predefined turn-on delay after the bipolar transistor device.
Figure 1C:
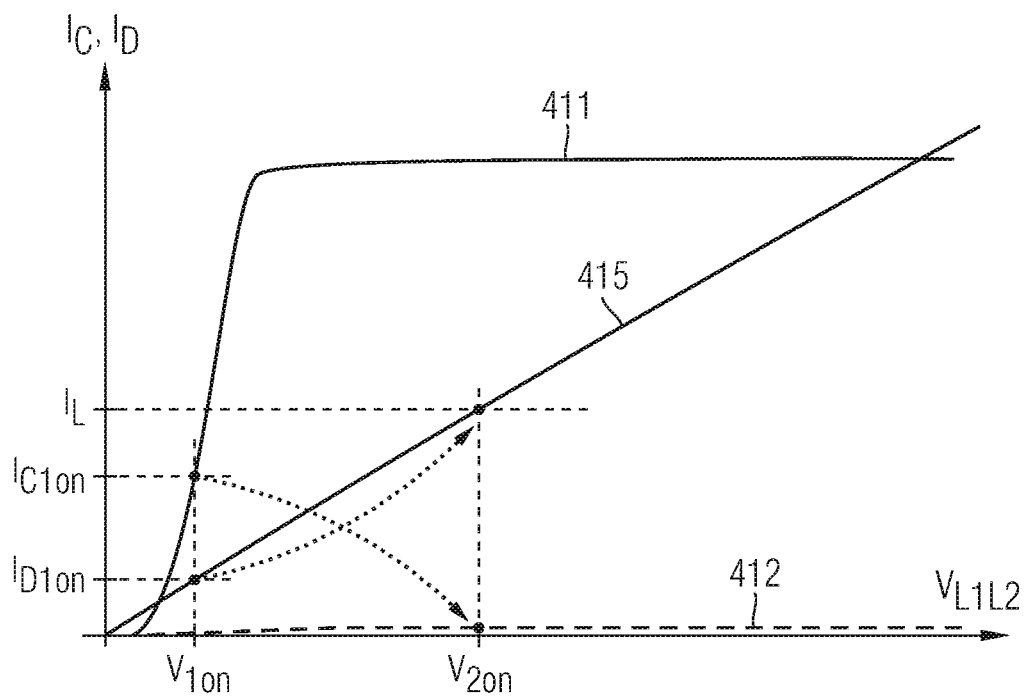
FIG. 1C is a schematic diagram showing forward I/V characteristics of the bipolar transistor device and of the wide-bandgap transistor device of FIG. 1A.

FIGS. 1A to 1C refer to an electric assembly 500 that may form or may be part of a high-side switch or that may form or may be part of a low-side switch of a half-bridge circuit, wherein the half-bridge circuit may be part of a H-bridge, a motor controller or a switched-mode power converter, e.g., a DC/DC power converter, a DC/AC power converter, an AC/AC power converter, or an AC/DC converter. The electric assembly 500 may employ hard switching and may be, e.g., a hard-switched motor controller or a hard-switched power converter.

FIG. 1A shows a bipolar transistor device 510 that is electrically connected between a first and a second load terminal L1, L2 of the electric assembly 500. The bipolar transistor device 510 may be a reverse blocking IGBT 511 without reverse conducting diode or an RC-IGBT (reverse-conducting IGBT) 512 with integrated reverse conducting diode 519. A load path of the bipolar transistor device 510 is electrically connected between the first and second load terminals L1, L2 of the electric assembly 500.

One of the first and second load terminals L1, L2, for example, the first load terminal L1 is at the supply side and may be electrically coupled to a power supply. The other one of the first and second load terminals L1, L2, for example, the second load terminal L2 is at the load side and may be electrically coupled to a load to which the power supply supplies a load current through the electric assembly 500.

The following description refers to combinations of n-channel IGBTs 511 or n-channel RC-IGBTs 512 with n-channel wide-bandgap transistor devices 560. Similar considerations apply for combinations of p-channel IGBTs 511 or p-channel RC-IGBTs 512 with p-channel wide-bandgap transistor devices 560.

A first control signal supplied to a gate terminal G1 of the bipolar transistor device 510 controls field effect transistor cells of the bipolar transistor device 510 by field effect and turns on and off the field effect transistor cells by forming inversion channels through body regions that separate a drain structure from source regions and that form pn junctions with both the drain structure and the source regions of the bipolar transistor device 510.

A wide-bandgap transistor device 560 is electrically connected to the first and second load terminals L1, L2 and in parallel to the bipolar transistor device 510. The wide-bandgap transistor device 560 is based on a semiconductor material with a bandgap of at least 2.0 eV. For example, the wide-bandgap material may be silicon carbide or gallium nitride.

The wide-bandgap transistor device 560 may be an HEMT (high electron mobility transistor), a JFET (junction field effect transistor), or an IGFET, for example, an MOSFET (metal-oxide-semiconductor field effect transistor) in the usual meaning including IGFETs with metal gates and IGFETs with gate electrodes containing heavily doped semiconductor material. According to an embodiment the wide-bandgap transistor device 560 may be an SiC-IGBT or an SiC transistor device operating in an exclusively unipolar conduction mode below a set-in voltage and in a bipolar conduction mode or in a mixed unipolar/bipolar conduction mode above the set-in voltage.

A second control signal applied to the control terminal CTR of the wide-bandgap transistor device 560 may turn on and off transistor cells of the wide-bandgap transistor device 560.

According to an embodiment the wide-bandgap transistor device 560 is a JFET with a plurality of junction transistor cells including channel regions forming pn junction with gate regions, wherein the channel regions separate source regions from a drain structure and form unipolar homojunctions with both the drain structure and the source regions. The second control signal supplied through the control terminal CTR effects depletion zones between the gate regions and the channel regions to pinch-off or to open conduction channels in the channel regions.

According to another embodiment the wide-bandgap transistor device 560 is an IGFET or an IGBT with a plurality of field effect transistor cells including body regions that separate a drain structure from source regions and that form pn junctions with both the drain structure and the source regions. The second control signal supplied through the control terminal CTR controls the field effect transistor cells by field effect and turns on and off the field effect transistor cells by forming inversion channels through the body regions.

A first output OUT1 of a control circuit 590 is electrically coupled to the gate terminal G1 of the bipolar transistor device 510 and a second output OUT2 of the control circuit 590 is electrically coupled to the control terminal CTR of the wide-bandgap transistor device 560. The control circuit 590 generates the first and second control signals, wherein under forward bias of the bipolar transistor device 510 the control circuit 590 turns on the bipolar transistor device 510 and turns on the wide-bandgap transistor device 560 at a predefined turn-on delay $t_{ondel}$ with respect to the turn-on of the bipolar transistor device 510.

According to an embodiment, the turn-on delay $t_{ondel}$ may be selected such that the wide-bandgap transistor device 560 turns on only shortly before the bipolar transistor device 510 turns off or even only contemporaneously with a turn-off of the bipolar transistor device 510.

The first and second control signals may be generated independently from each other by using different driver outputs of a gate driver circuit of the control circuit. Alternatively, a network circuit that may include resistors, capacitors and/or diodes may derive one of the first and second control signals from the other one of the first and second control signals or both the first and second control signals from a common source control signal output by a gate driver circuit.

FIG. 1B shows the first control signal 401 output by the control circuit 590 and supplied to the gate terminal G1, the second control signal 402 output by the control circuit 590 and supplied to the control terminal CTR of the wide-bandgap transistor device 560, as well as the voltage drop 405 across the load terminals L1, L2. The electric assembly 500 of FIG. 1A is under forward bias and blocks a positive blocking voltage +VB across the load terminals L1, L2 for t<t1.

At t=t1 the first control signal 401 for turning on the bipolar transistor device 510 rises from an off-level gate voltage $V_{goff}$ of, e.g., 0V or −15V to an on-level gate voltage $V_{gon}$ above a first threshold voltage $V_{th1}$ of, e.g., 4.5V. For example, the on-level gate voltage $V_{gon}$ is +15V. The voltage bias 405 across the load terminals L1, L2 drops to the saturation voltage of the bipolar transistor device 510.

After the predefined turn-on delay $t_{ondel}$ at t=t2, the second control signal 402 for turning on the wide-bandgap transistor device 560 rises from an off-level control voltage $V_{coff}$ of, e.g., 0V or −15V to above a second threshold voltage $V_{th2}$ of, e.g., 1.5V, 3V or 5V to an on-level control voltage $V_{con}$ of, e.g., +5V, +15V, or +20V. The on-level control voltage $V_{con}$ may have the same level as the on-level gate voltage $V_{gon}$, may be higher than $V_{gon}$, or may be lower than $V_{gon}$. For example, in case the wide-bandgap transistor device 560 is a JFET, $V_{con}$ may be at most 2V. The turn-on delay $t_{ondel}$ may be in a range from 200 ns to 15 µs, for example in a range from 500 ns to 10 µs, or 1 µs to 5 µs for voltage classes up to, e.g., 1200V and 5 µs to 10 µs for voltage classes up to, e.g., 6.5 kV. The voltage bias 405 across the load terminals L1, L2 may drop further to a first on-state voltage $V_{1on}$ due to the additional current path through the wide-bandgap transistor device 560.

During the turn-on delay $t_{ondel}$ only the bipolar transistor device 510 is on. In case a short-circuit condition occurs, e.g., the other switch in a half-bridge condition is still conducting or a short-circuit appears at the load of the half-bridge circuit, a short-circuit detection circuit may detect the short-circuit condition, suppresses turn-on of the wide-bandgap transistor device 560 and turns off the bipolar transistor derive 510.

Since the wide-bandgap transistor device 560 is not turned on under short-circuit conditions, a low short-circuit ruggedness of the wide-bandgap transistor device 560 does not adversely affect overall short-circuit ruggedness. As a result, a cost-efficient wide-bandgap transistor device 560 with small active area and high transconductance can be used in parallel to the silicon bipolar transistor device 510. For example, a maximum rating short circuit current of the wide-bandgap transistor device 560 may be at least the nominal collector current $I_c$, e.g., at least three times the nominal collector current $I_c$ of the bipolar transistor device 510.

At t=t3 the first control signal 401 turns off the bipolar transistor device 510, wherein the first control signal 401 falls from $V_{gon}$, e.g., from +15V to below the first threshold voltage $V_{th1}$. For example, the first control signal 401 falls to a $V_{goff}$ of 0V or −15V. Due to the higher resistance of the remaining path through the wide-bandgap transistor device 560 the voltage bias 405 rises to a second on-state voltage $V_{2on}$.

After a predefined turn-off delay $t_{offdel}$ at t=t4, the second control signal 402 turns off the wide-bandgap transistor device 560, wherein the second control signal 402 falls from $V_{con}$ of, e.g., +15V to below the second threshold voltage $V_{th2}$, e.g., to a $V_{coff}$ of 0V, wherein $V_{coff}$ may be equal to $V_{goff}$, higher, or lower. The turn-off delay $t_{offdel}$ may be in a range from 1 µs to 100 µs, for example in a range from 1 µs to 3 µs for blocking voltages of at least 1200V and up to 100

μs for blocking voltages of at least 6.5 kV. The voltage bias 405 rises again to the blocking voltage +V$_B$.

During the turn-off delay t$_{offdel}$ the wide-bandgap transistor device 560 conveys most of the load current at low voltage drop across the load terminals L1, L2. As a consequence, the bipolar transistor device 510 desaturates at a low voltage such that recovery losses are significantly reduced compared to a configuration without the wide-bandgap transistor device 560.

The active area of the wide-bandgap transistor device 560 is sufficiently high to carry the load current during t$_{offdel}$, but can be significantly smaller than necessary for carrying the maximum short-circuit current. A desaturation threshold of the wide-bandgap transistor device 560 may be at least three times, e.g, at least ten times the nominal collector current I$_c$ of the bipolar transistor device 510.

FIG. 1C shows the forward on-state I/V characteristic 411 and the forward off-state I/V characteristic 412 of the bipolar transistor device 510 as well as the forward on-state I/V characteristic 415 of the wide-bandgap transistor device 560.

For t2<t<t3 both the bipolar transistor device 510 and the wide-bandgap transistor device 560 are conductive. The total load current I$_L$ splits among a collector current I$_{C1on}$ through the bipolar transistor device 510 and a drain current I$_{D1on}$ through the wide-bandgap transistor device 560 and the first on-state voltage V$_{1on}$ across the load terminals L1, L2 is low. The drain current I$_{D1on}$ may be between 1% and 45%, for example in a range from 5% to 25% of the nominal total load current I$_L$.

For t>t3 the bipolar transistor device 510 ceases to conduct and the wide-bandgap transistor device 560 carries the complete load current I$_L$. The resulting second on-state voltage V$_{2on}$ is higher than V$_{1on}$, but low compared to a comparative example without wide-bandgap transistor device 560 such that reverse recovery losses in the bipolar transistor device 510 are significantly reduced.

Figure 1D:
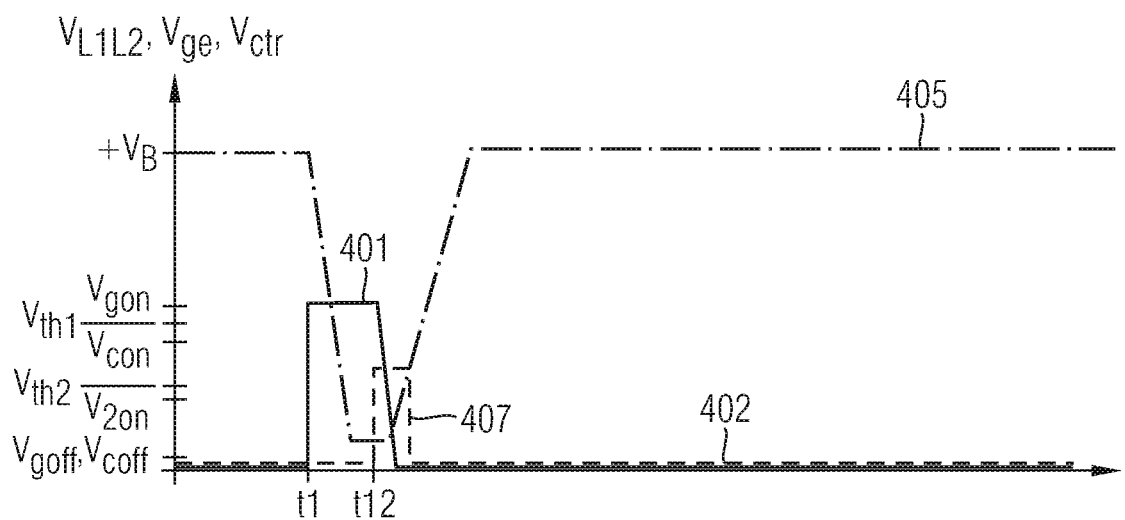
FIG. 1D is a schematic time chart illustrating control signals at the gate terminal of the bipolar transistor device and at the control terminal of the wide-bandgap transistor device of FIG. 1A according to an embodiment concerning short-circuit protection.

FIG. 1D shows a time chart in case a short-circuit signal occurs at t=t12 between t=t1 and t=t2. In response to the short-circuit detection signal 407 the control circuit 590 controls the first control signal 401 to fall below the first threshold voltage V$_{th1}$ and suppresses a rise of the second control signal 402 to above the second threshold voltage V$_{th2}$.

Compared to approaches without turn-on delay t$_{ondel}$, the active chip area of the wide-bandgap transistor device 560 can be significantly smaller or designed with higher transconductance, because the turn-on delay t$_{ondel}$ prevents the wide-bandgap transistor device 560 from carrying the full short circuit current appearing in the application such that the requirement for the wide-bandgap transistor device 560 as regards short-circuit ruggedness relaxes. Since costs of wide-bandgap semiconductor devices significantly decrease with smaller active area, the electric assembly 500 provides a cost-effective solution to reduce switching losses in the bipolar transistor device 510.

Figure 1E:
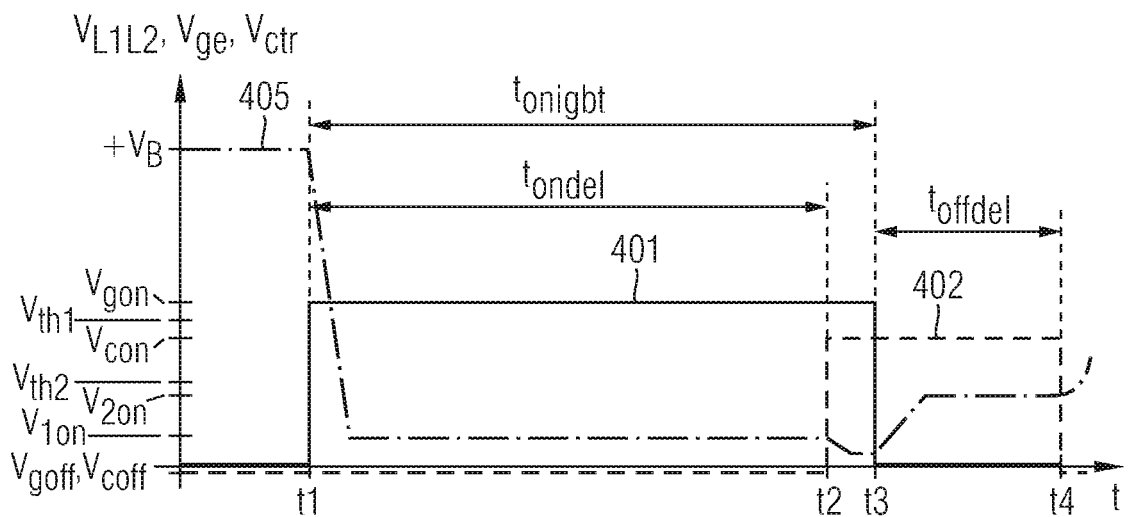
FIG. 1E is a schematic time chart illustrating control signals at the gate terminal of the bipolar transistor device and at the control terminal of the wide-bandgap transistor device of FIG. 1A according to an embodiment with the wide-bandgap transistor device turned on shortly before the bipolar transistor device turns off.

FIG. 1E shows a first control signal 401, which the control circuit 590 outputs and feeds to the gate terminal G1 of the bipolar transistor device 510 of FIG. 1A, and a second control signal 402, which the control circuit 590 outputs and supplies to the control terminal CTR of the wide-bandgap transistor device 560. For t<t1 the electric assembly 500 of FIG. 1A is under forward bias and blocks a positive blocking voltage +VB across the load terminals L1, L2.

At t=t1 the first control signal 401 for turning on the bipolar transistor device 510 rises to an on-level gate voltage V$_{gon}$ and at t=t3 the first control signal 401 falls back to the off-level gate voltage V$_{goff}$. At t=t2 shortly before t3 the second control signal 402 for turning on the wide-bandgap transistor device 560 rises from an off-level control voltage V$_{coff}$ to an on-level control voltage V$_{con}$. The turn-on delay t$_{ondel}$=t2−t1 may be at least 80%, e.g. 90%, of the total on-time t$_{onigbt}$=t3−t1 such that the wide-bandgap transistor device 560 is on predominantly only during a desaturation phase of the bipolar transistor device 510. Requirements concerning the thermal ruggedness of the wide-bandgap transistor device 560 may be relaxed. The second control signal 402 may change to the off-level control voltage V$_{coff}$ after a defined turn-off delay t$_{offdel}$ as illustrated in FIG. 1B.

Figure 1F:
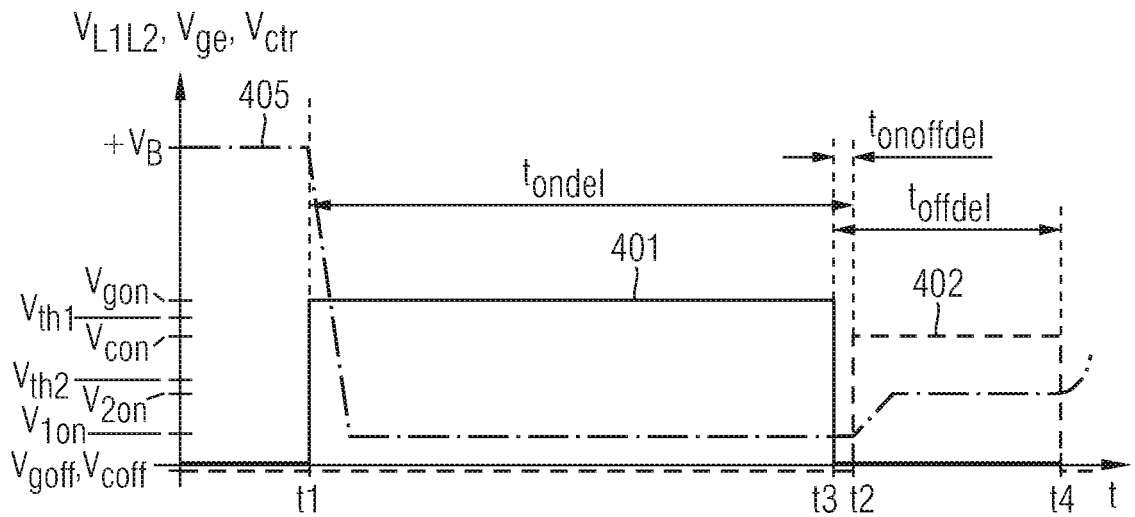
FIG. 1F is a schematic time chart illustrating control signals at the gate terminal of the bipolar transistor device and at the control terminal of the wide-bandgap transistor device of FIG. 1A according to an embodiment with the wide-bandgap transistor device turned on when the bipolar transistor device turns off.

In FIG. 1F the second control signal 402 reaches the on-level control voltage V$_{con}$ shortly after, e.g., within a turn-off time of the bipolar transistor device 510, the first control signal 401 for turning on the bipolar transistor device 510 falls to the off-level gate voltage V$_{goff}$. The on/off delay t$_{onoffdel}$=t2−t3 with t2>t3 is at most the turn-off time of the bipolar transistor device 510, wherein the turn-off time is a period between fall of the control voltage V$_{CTR}$ to below the second threshold voltage V$_{th2}$ and rise of the voltage 405 across the load terminals L1, L2 to above a predefined level, e.g. 50% VB, 10% VB, e.g., 5% VB. The period t3−t2 may be in a range from −2 μs to 5 μs for a bipolar transistor device 510 with a blocking capability up to 1200 V and in a range from −6 μs to 20 μs for a bipolar transistor device 510 with a blocking capability up to 6500 V. In this case, the wide-bandgap device 560 safely turns on before the voltage 405 across the load terminals L1, L2 rises significantly. On the other hand, the on-time of the wide-bandgap transistor device 560 of FIG. 1A is as short as reasonable and the thermal strain effective on the wide-bandgap device 560 is comparatively low. The wide-bandgap transistor device 560 may by a comparatively small device with small semiconductor volume.

Figure 2A:
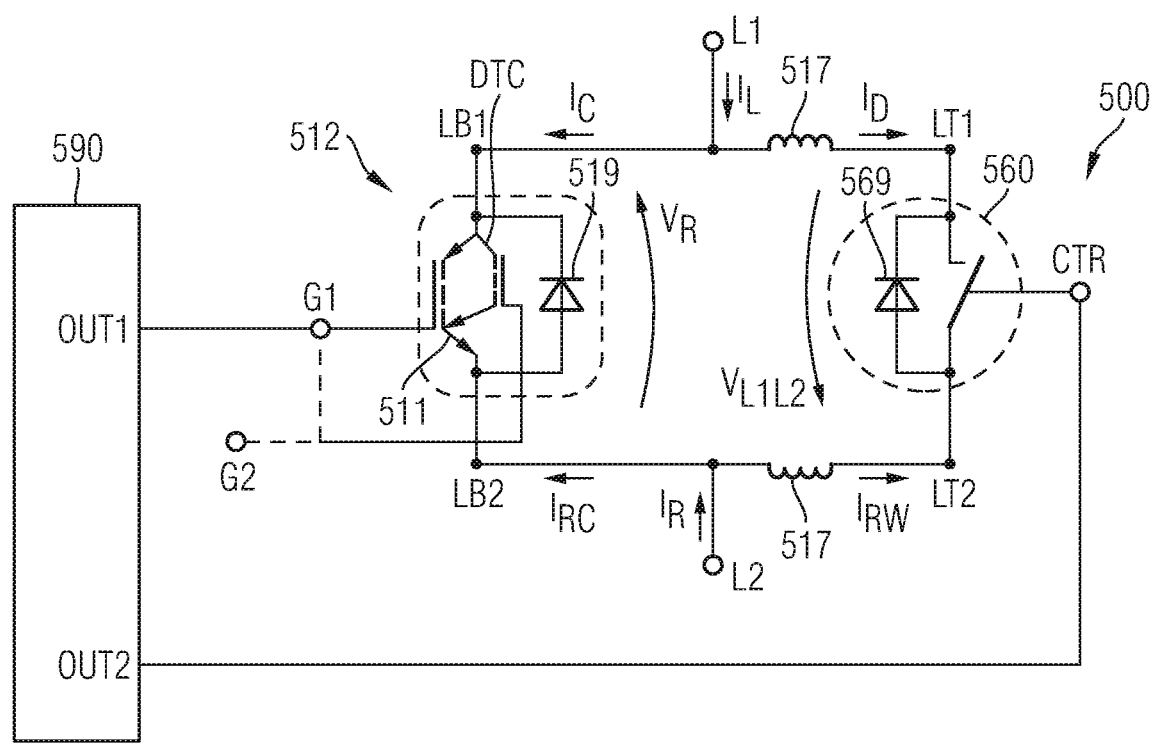
FIG. 2A is a schematic circuit diagram of an electric assembly including a reverse conducting bipolar transistor device with desaturation transistor cells and a wide-bandgap transistor device electrically connected in parallel with the reverse conducting bipolar transistor device according to another embodiment.
Figure 2B:
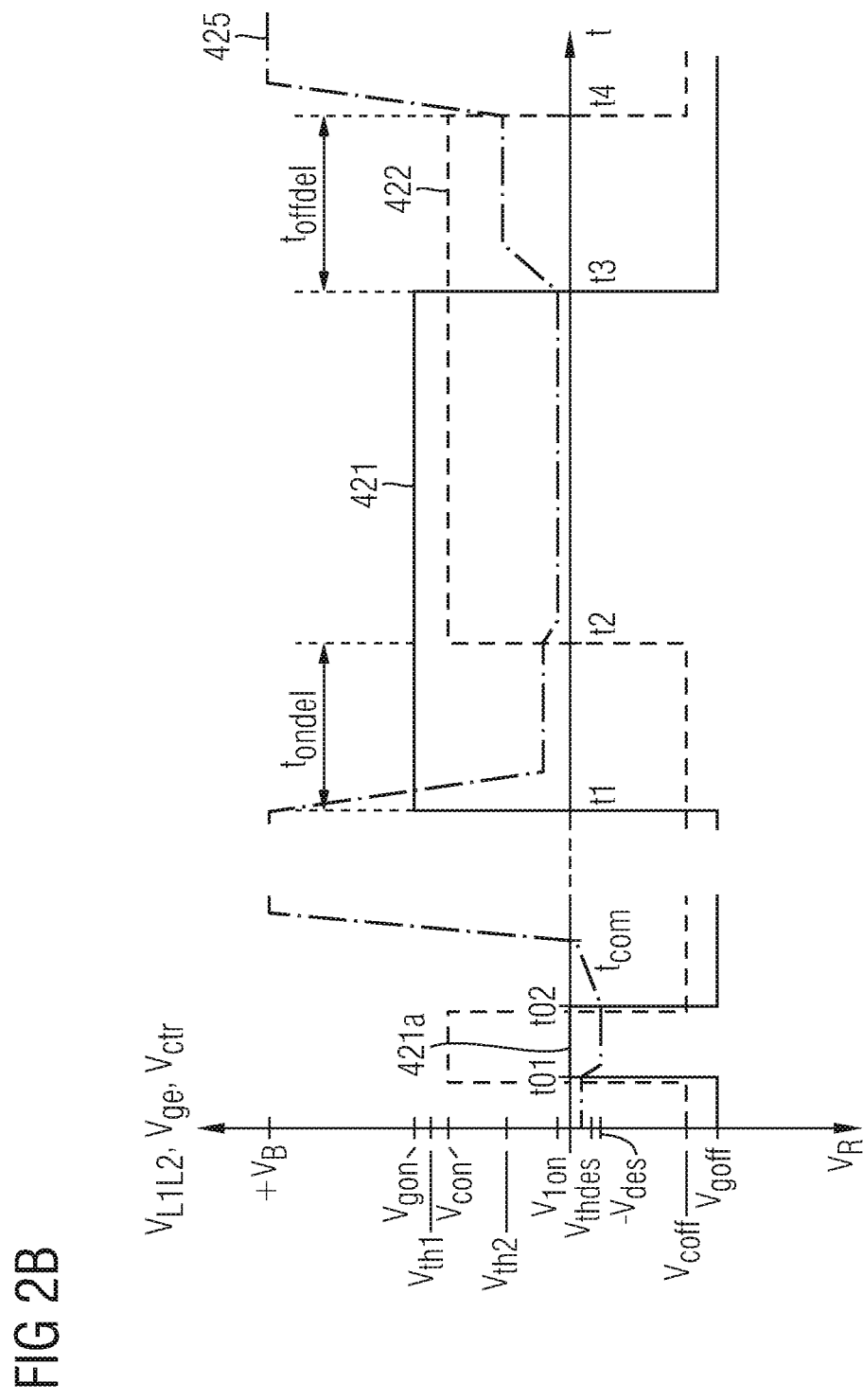
FIG. 2B is a schematic time chart illustrating control signals at the gate terminal of the bipolar transistor device and of the control terminal of the wide-bandgap transistor device of FIG. 2A.
Figure 2C:
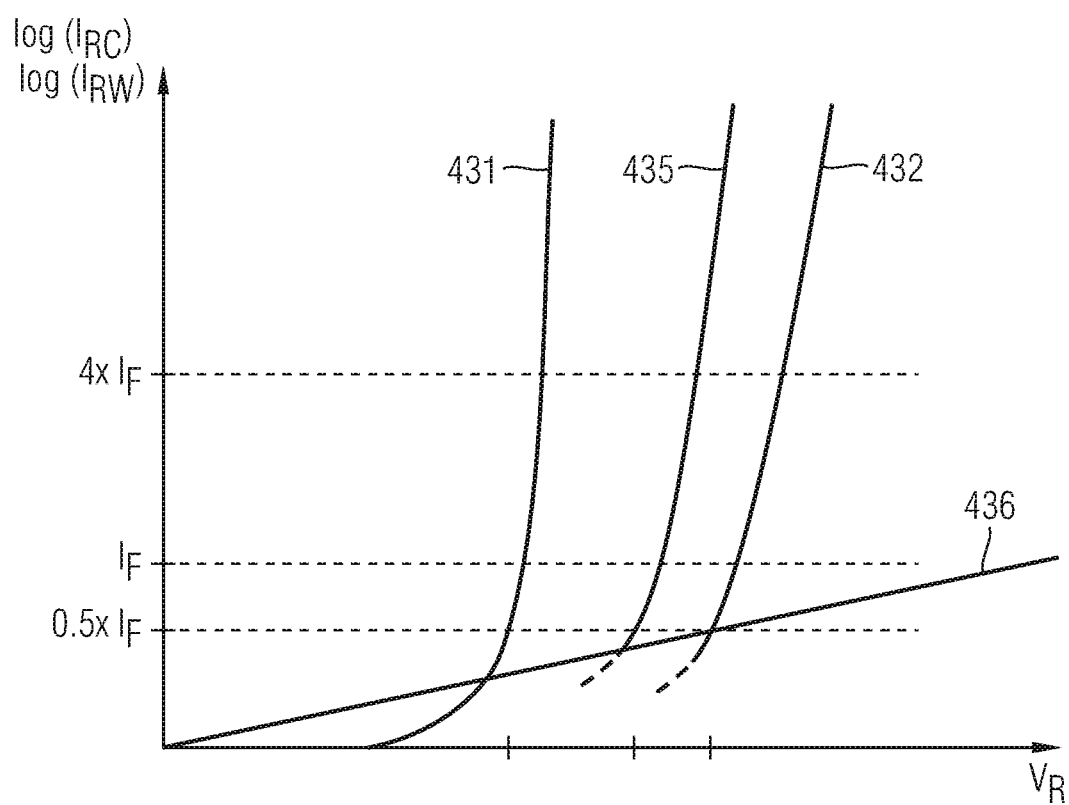
FIG. 2C is a schematic diagram showing reverse I/V characteristics of the reverse conducting bipolar transistor device and the wide-bandgap transistor device of FIG. 2A.

FIGS. 2A to 2C refer to embodiments combining the forward control as illustrated in FIGS. 1A to 1C with a desaturation of a reverse conducting diode of the bipolar transistor device under reverse bias.

In the electric assembly 500 of FIG. 2A, the wide-bandgap transistor device 560 may be a SiC-JFET, a purely unipolar SiC-IGFET, a SiC-IGFET with a bipolar component, or a SiC-IGBT, by way of example.

The wide-bandgap transistor device 560 and the switching device 510 are separated semiconductor devices in different housings and are electrically connected through strip conductors and/or wirings bonds. Physical connections between a first load terminal LT1 of the wide-bandgap transistor device 560 and a first load terminal LB1 of the bipolar transistor device 510 and/or between a second load terminal LT2 of the wide-bandgap transistor device 560 and a second load terminal LB2 of the bipolar transistor device 510 may have an intrinsic, non-negligible effective inductance greater 0.1 nH. In addition or in the alternative, discrete inductive elements 517 may be electrically connected between first load terminals LB1, LT1 and/or between second load terminals LB2, LT2 of the bipolar transistor device 510 and wide-bandgap device 560 assigned to the same load terminal L1, L2, respectively. The effective inductance may be at least 0.1 nH, for example, at least 1 nH or at least 10 nH.

The bipolar transistor device 510 is an RC-IGBT 512 with a reverse conducting diode 519. The bipolar transistor device 510 further includes desaturation transistor cells DTC. The desaturation transistor cells DTC may be field effect transistor cells exclusively used for desaturation or may be some of the transistor cells that turn on and off the load current through the bipolar transistor device 510 under forward bias.

The desaturation transistor cells DTC may be selectively addressable with respect to transistor cells exclusively used for turning on and off the load current under forward bias. For example, gate electrodes of the desaturation transistor cells DTC and gate electrodes of transistor cells exclusively used for turning on and off the load current may be separated from each other, wherein the bipolar transistor device 510 includes an auxiliary terminal G2 exclusively connected to the desaturation transistor cells DTC and different control signals are applied to the gate terminal G1 and the auxiliary terminal G2.

According to another embodiment, the gate electrodes of the desaturation transistor cells DTC and the gate electrodes of the transistor cells exclusively used for turning on and off the load current are connected to each other and the threshold voltage $V_{thdes}$ of the desaturation transistor cells DTC deviates from a threshold voltage $V_{th1}$ of the transistor cells exclusively used for turning on and off the bipolar transistor device 510 under forward bias.

FIG. 2B shows a first control signal 421 output by the control circuit 590 and supplied to the gate terminal G1, a second control signal 422 output by the control circuit 590 and supplied to the control terminal CTR of the wide bandgap transistor device 560 as well as the voltage bias 405 across the load terminals L1, L2.

For $t<t_{01}$ the electric assembly 500 of FIG. 1A is reverse-biased, the reverse conducting diode 519 is saturated and a low negative reverse saturation voltage $V_{sat}$ drops across the load terminals L1, L2.

Between $t=t01$ and $t=t02$ in the reverse-biased state, the first control signal 421 contains a desaturation pulse 421a selectively addressing the desaturation transistor cells DTC of the RC-IGBT 512. For example, the voltage level of the first control signal 421 during the desaturation pulse 421a is above a desaturation threshold $V_{thdes}$ above which the desaturation transistor cells DTC turn on and below a first threshold voltage $V_{th1}$ above which the transistor cells used for controlling the load current in the forward biased state turn on. Alternatively, the desaturation pulse 421a is selectively applied to an auxiliary terminal G2 exclusively connected to gate electrodes of the desaturation transistor cells DTC.

The desaturation pulse 421a ends timely before a voltage bias across the electric assembly 500 changes from reverse to forward at $t=t_{com}$ such that the electronic assembly has full blocking capability at $t=t_{com}$, when the voltage $V_{L1L2}$ across the load terminals L1, L2 of FIG. 2A changes from a negative reverse voltage to a positive blocking voltage +VB.

The desaturation pulse 421a selectively turns on the desaturation transistor cells DTC such that gated channels of the desaturation transistor cells DTC start to carry at least a portion of the reverse current $I_R$ through the electric assembly 500. In the on-state, the gated channels of the desaturation transistor cells DTC reduce the voltage drop across at least portions of all or some of the pn junctions of the reverse conducting diode 519 to below the built-in potential such that the concerned portions of the pn junctions do not longer inject charge carriers.

Since the injection of charge carriers along at least portions of some of the pn junctions of the body diode 519 is suppressed, overall emitter efficiency is reduced, charge carrier plasma density drops, the electric resistance increases and the voltage bias 405 rises to a more negative desaturation voltage $V_{des}$.

Under reverse bias of the electric assembly 500 the wide-bandgap transistor device 560 is also reverse biased. The second control signal 422 may image the desaturation pulse, wherein both the leading and the trailing edge may be without delay with respect to the leading and trailing edge of the desaturation pulse 421a in the first control signal 421 or at least one of the leading edge and the trailing edge may be delayed with respect to the corresponding edge of the first control signal 421.

When the second control signal 422 contains a switching pulse imaging to some degree the desaturation pulse 421a, the wide-bandgap transistor device 560 may turn on during desaturation and increases desaturation efficiency by conducting a portion of the load current $I_L$ during desaturation of the reverse conducting diode 519 of the RC-IGBT 512.

According to other embodiments, the second control signal 422 does not include a switching signal that corresponds to the desaturation pulse 421a and that turns on the wide-bandgap transistor device 560 during desaturation of the reverse conducting diode 519 of the RC-IGBT 512. For example, the second control signal 422 may be equal to an off-voltage $V_{coff}$ throughout the reverse bias phase. When the second control signal 422 does not contain a switching pulse turning on the wide-bandgap transistor device 560 during desaturation, a body diode 569 of the wide-bandgap transistor device 560 may increase desaturation efficiency by carrying a portion of the load current $I_L$.

Desaturation by selectively turning on desaturation transistor cells TC may be carried out before commutation or before a reverse current turns off. The electric assembly 500 of FIG. 2A may combine a desaturation cycle as described above with an on/off delay as described with reference to FIGS. 1B to 1F.

FIG. 2C shows a saturation I/V characteristic 431 of the reverse biased RC-IGBT 512, wherein the saturation I/V characteristic 431 results from the bipolar current through the reverse conducting diode 519 in case gated channels of any desaturation transistor cells DTC used for desaturation are turned off. In the saturated reverse-conducting mode, a gate-to-emitter voltage $V_{ge}$ may be below the first threshold voltage $V_{th1}$, for example $V_{ge}=0V$ or $V_{ge}=-15V$, by way of example. The remaining reverse current through the desaturated RC-IGBT at the end of the desaturation period at $t=t02$ defines a desaturation I/V characteristic 432 of the reverse biased RC-IGBT 512. Since the charge carrier plasma is less dense with respect to the saturated state, with reference to the saturation I/V characteristic 431 the desaturation I/V characteristic 432 is shifted to higher values of the reverse voltage $V_R$ for the same reverse current $I_{RC}$ through the RC-IGBT 512. The resistance is significantly greater than for the high bipolar current of the saturated RC-IGBT 512 and results in a higher voltage drop across the RC-IGBT 512 for the same reverse current $I_{RC}$ through the RC-IGBT 512 or in a smaller reverse current $I_{RC}$ at the same reverse voltage $V_R$.

When the wide-bandgap transistor device 560 is off, a body diode 569 of the wide-bandgap transistor device 560 determines the mode of operation of the wide-bandgap transistor device 560 under reverse bias, wherein a diode I/V characteristic 435 of the body diode 569 is a function of type, layout, dimensions, dopant gradients, and dopant concentrations in the wide-bandgap transistor device 560.

Alternatively, the wide-bandgap transistor device 560 may be turned on under reverse bias up to $t=t01$, to $t01<t<t02$ or to $t=t2$ to improve at least one of the resistance of the electric assembly 500 during saturation mode of the reverse-conducting diode 519 and desaturation efficiency.

According to an embodiment, the wide-bandgap transistor device 560 is on during saturation and material, dimensions, layout, dopant concentrations and dopant gradients of the wide-bandgap transistor device 560 are tuned such that below the nominal diode forward current $I_F$ of the RC-IGBT 512, the on-state I/V characteristic 436 of the wide-bandgap transistor device 560 intersects the saturation I/V characteristic 431 of the reverse biased RC-IGBT 512 in a range of the reverse current $I_R$ up to $0.1*I_F$.

At low-current conditions with only a low reverse current $I_R$ through the electric assembly 500, the wide-bandgap transistor device 560 takes most of the total reverse current $I_R$ at a lower reverse voltage $V_R$ than for a typical pn junction such that, for example, power consumption under open-circuit conditions and power conversion efficiency under low-load conditions can significantly be improved. The wide-bandgap transistor device 560 is turned off timely before $t_{com}$, for example within, during or at the end of the desaturation pulse 421a.

Alternatively or in addition, during desaturation of the RC-IGBT 512 the second control signal applied to the control terminal CTR is selected to turn on the wide-bandgap transistor device 560, wherein the on-state I/V characteristic 436 is adjusted such that the reverse current $I_{RW}$ through the wide-bandgap transistor device 560 is greater than the reverse current $I_{RC}$ through the reverse biased RC-IGBT 512 during desaturation at least for a total reverse current $I_R$ equal to or greater than $I_F/2$, wherein $I_F$ is the nominal diode forward current up to which the operation of the RC-IGBT 512 is safe, e.g., at least for $I_R$ equal to or greater than $I_F$.

As a consequence, within the complete nominal operating range of the RC-IGBT 512 only few charge carriers are injected into a semiconductor portion of the RC-IBGT 512 during desaturation such that desaturation efficiency is high.

According to an embodiment, type, layout, dimensions, dopant gradients and dopant concentrations of the wide-bandgap transistor device 560 are defined such that for reverse currents $I_{RC}$ of the RC-IGBT 512 up to at least the nominal diode forward current $I_F$ of the RC-IGBT 512, e.g., up to twice or up to four times the nominal diode forward current $I_F$, the on-state I/V characteristics 436 is on the left hand side of the desaturation I/V characteristic 432 of the RC-IGBT 512.

According to an embodiment, at least within the nominal operating range the wide-bandgap transistor device 560 carries the greater portion of the total reverse current $I_R$ through the electric assembly 500 during desaturation and the reverse current $I_{RW}$ through the wide-bandgap transistor device 560 is greater than the reverse current $I_{RC}$ through the reverse-biased RC-IGBT 512. For $I_{RC}$ greater than $I_F$, $2*I_F$ or greater than $4*I_F$, the RC-IGBT 512 may conduct the greater portion of the total reverse current $I_R$.

Typically, in the reverse biased saturation mode of the RC-IGBT 512 all desaturation transistor cells are off such that the exclusively bipolar current ensures high charge carrier plasma density and low ohmic resistance of the RC-IGBT 512. Since the high density charge carrier plasma increases switching losses, conventional desaturable reverse conducting bipolar transistor devices, e.g. RCDC (reverse-conducting with diode control)-IGBTs, are desaturated before commutation by switching on the desaturation transistor cells in a desaturation period preceding the commutation that follows the transition from reverse biased to forward biased.

The concerned desaturation transistor cells DTC typically turn off again timely before commutation such that the RC-IGBT 512 safely blocks at the time commutation starts. In this way, critical circuit conditions can be avoided, for example, a short-circuit condition with both the high side and the low side switch of a half-bridge circuit being turned on. During desaturation a unipolar current flows through the desaturation transistor cells and a bipolar current may flow in regions without turned-on desaturation transistor cells to keep the reverse current flowing at sufficiently low reverse voltage VR. As a consequence, charge carriers are also present in the semiconductor portion during desaturation. In a safety period between the end of desaturation and start of commutation a bipolar current again supersedes the unipolar current flow through the desaturation transistor cells, wherein the charge carriers already present in the semiconductor portion have impact on the starting level of the rise of the charge carrier density and determine the overall stored charge Qrr in the RCDC and thus the overall switching losses.

If during desaturation the mode of operation of the wide-bandgap transistor device 560 is described by the on-state I/V characteristics 436 as defined above, a significant portion of the reverse current $I_R$ through the electric assembly 500 may flow as reverse current $I_{RW}$ through the wide-bandgap transistor device 560 and only few charge carriers flow as diode current $I_{RC}$ through the RC-IGBT 512 during desaturation. Starting level and gradient of the rise of the charge carrier plasma density in the semiconductor portion are reduced such that the electric assembly 500 combines high desaturation efficiency with high reliability against critical circuit conditions in the application. The wide-bandgap transistor device 560 may turn off at the end of the desaturation pulse 421a.

Figure 2D:
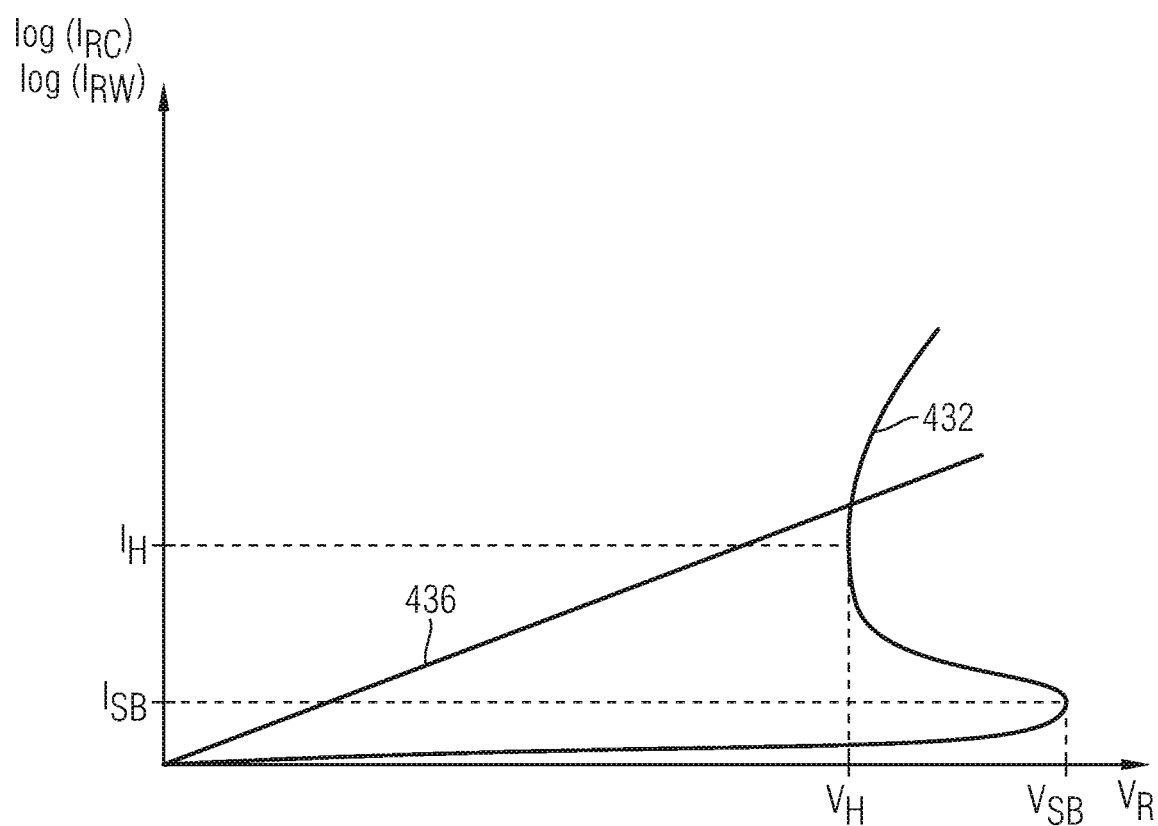
FIG. 2D is a schematic diagram showing reverse I/V characteristics of the reverse conducting bipolar transistor device and the wide-bandgap transistor device of FIG. 2A, wherein the reverse conducting bipolar transistor device shows a snapback behavior.

FIG. 2D refers to an embodiment with an RC-IGBT 512 designed with a pronounced snapback in the desaturation mode in a range of a diode current $I_{RC}$ lower than a snapback hold current $I_H$. At least up to the snapback current $I_{SB}$, to the snapback hold current $I_H$, or to twice or ten times the snapback hold current $I_H$, the on-state I/V characteristic 436 is on the left hand side of the desaturation I/V characteristic 432 of the reverse biased RC-IGBT 512 such that up to the snapback current $I_{SB}$, the snapback hold current $I_H$, or to twice or ten times the snapback hold current $I_H$, the wide-bandgap transistor device 560 carries a greater portion of the total reverse current $I_R$ through the electric assembly 500.

Since the wide-bandgap transistor device 560 takes most of the current in case the desaturation transistor cells DTC are on, a snapback behavior of the reverse-biased RC-IGBT 512 during desaturation does not come into effect or is attenuated. The RC-IGBT 512 can be designed with pronounced snapback under reverse bias, because the wide-bandgap transistor device 560 suppresses or at least attenuates the effect of the snapback on the application. For example, n-doped regions for reverse current and p-doped regions for forward current at the collector side of the RC-IGBT 512 may be optimized for a low ohmic resistance $R_{RC}$ in the reverse conducting mode and a low ohmic resistance Rdson in the on-state and specific transistor cells designed for attenuating the snapback effect can be omitted.

The wide-bandgap transistor device 560 may be designed with an on-state I/V characteristic 436 such that the voltage drop across the wide-bandgap transistor device 560 is always smaller than a maximum snapback voltage $V_{SB}$ or snapback hold voltage $V_H$ of the RC-IGBT 512. Alternatively, the wide-bandgap transistor device 560 is designed with an on-state I/V characteristic 436 such that a reverse current $I_{RW}$ through the reverse biased wide-bandgap transistor device 560 is greater than the reverse current $I_{RC}$ through the RC-IGBT 512 up to at least four times the maximum rating diode forward current $I_F$ of the RC-IGBT 512 to safely avoid any snapback of the RC-IGBT 512.

Alternatively, the wide-bandgap transistor device 560 is off during desaturation and the reverse I/V characteristic during desaturation is given by a diode I/V characteristic 435 of the body diode 569. Then the body diode 569 of the wide-bandgap transistor device 560 may be designed with a diode I/V characteristic 435 such that the voltage drop across the JFET is always smaller than a maximum reverse snapback voltage $V_{SB}$ or reverse snapback hold voltage $V_H$ of the RC-IGBT 512. Alternatively, the body diode 569 is designed with a diode I/V characteristic 435 such that a reverse current $I_{RJ}$ through the reverse biased wide-bandgap transistor device 560 is greater than the reverse current $I_{RC}$ through the RC-IGBT 512 up to at least two times, e.g. up to four times the maximum rating diode forward current $I_F$ of the RC-IGBT 512 to safely avoid any snapback of the RC-IGBT 512.

Figure 3A:
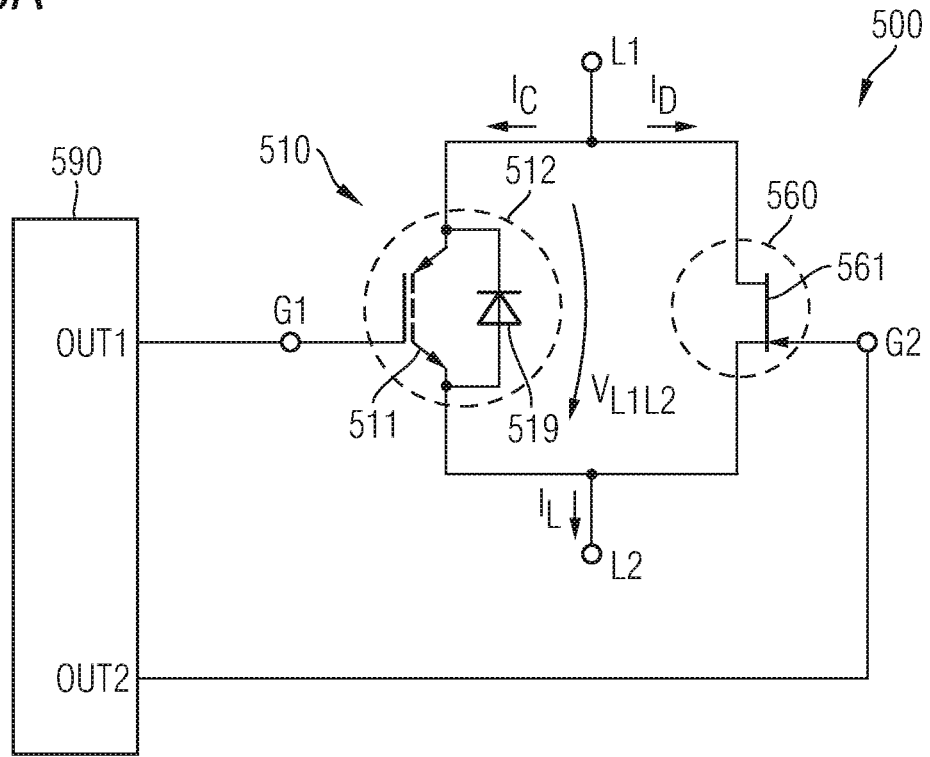
FIG. 3A is a schematic circuit diagram of an electric assembly according to an embodiment including a JFET without body diode.

In FIG. 3A the wide-bandgap transistor device 560 includes an SiC-JFET 561 without body diode, wherein the control circuit 590 is electrically connected to a gate terminal G2 of the SiC-JFET 561 and turns on the SiC-JFET 561 at least during a portion of a desaturation pulse applied under reverse bias of the electric assembly 500 to the gate terminal G1 of the bipolar transistor device 510.

Figure 3B:
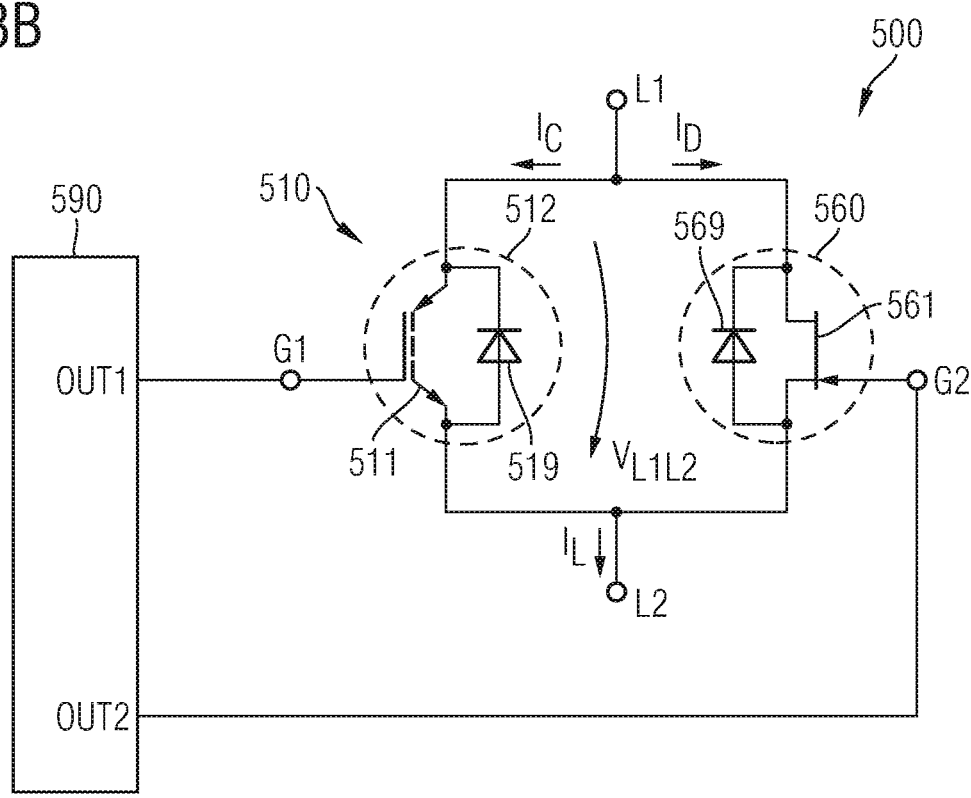
FIG. 3B is a schematic circuit diagram of an electric assembly according to an embodiment including a JFET with body diode.

In FIG. 3B the wide-bandgap transistor device 560 includes a SiC-JFET 561 including an integrated body diode 569 that, e.g., increases desaturation efficiency of the bipolar transistor device 510.

In FIG. 3C a SiC-IGFET 562 used as the wide-bandgap transistor device 560 includes an integrated body diode 569 that increases desaturation efficiency of the bipolar transistor device 510.

FIGS. 4A to 4D refer to embodiments of an SiC-IGFET 562 and an SiC-IGBT 563 used as wide-bandgap transistor device 560.

Figure 4A:
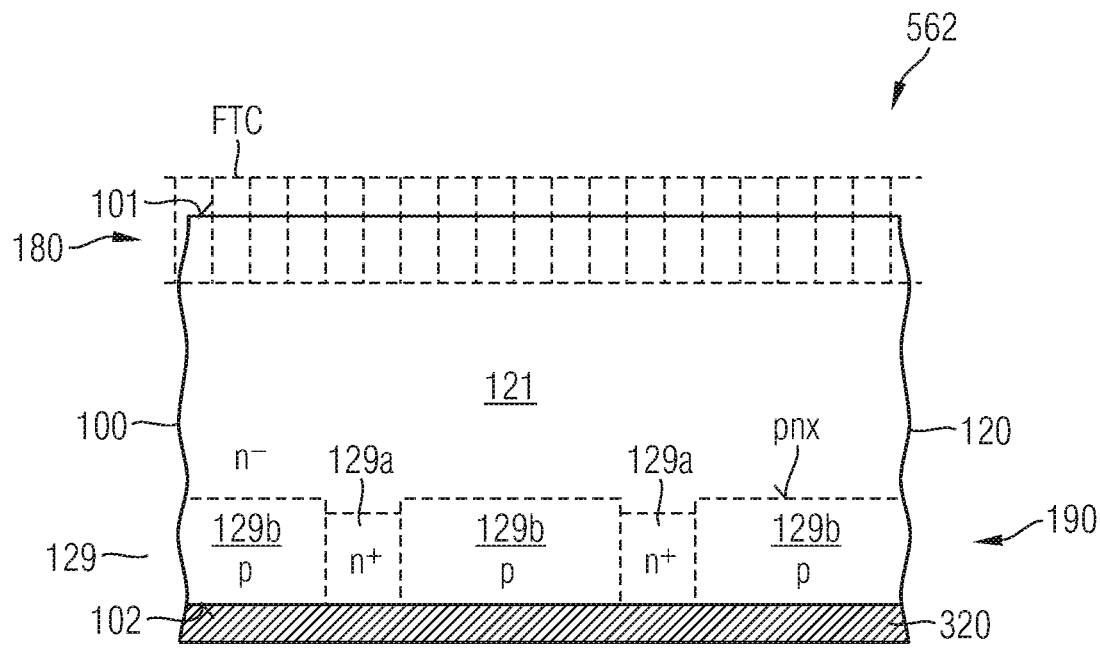
FIG. 4A is a schematic vertical cross-sectional view of a portion of a SiC-IGFET with a bipolar branch with n-doped and p-doped regions in front of the drain contact.

The wide-bandgap transistor device 560 of FIG. 4A is an SiC-IGFET 562 that includes field effect transistor cells FTC formed in a semiconductor portion 100 from crystalline wide-bandgap semiconductor material such as SiC, for example 4H—SiC.

At a front side the semiconductor portion 100 has a first surface 101 which may include coplanar surface sections. The first surface 101 may coincide with a main crystal plane or may be tilted to a main crystal plane by an off-axis angle, which absolute value may be at least 2° and at most 12°, e.g., about 4°. According to an embodiment, the first surface 101 may be serrated and includes parallel first surface sections shifted to each other and tilted to a horizontal plane as well as second surface sections tilted to the first surface sections and connecting the first surface sections such that cross-sectional line of the serrated first surface 101 approximates a saw-tooth line.

On the back of the semiconductor portion 100 an opposite second surface 102 may extend parallel to the first surface 101. A distance between the first surface 101 at the front and a second surface 102 on the back is related to a nominal blocking capability of the SiC-IGFET 562. A total thickness of the semiconductor portion 100 between the first and second surfaces 101, 102 may be in the range of several hundred nm to several hundred μm. The normal to the first surface 101 defines a vertical direction and directions parallel to the first surface 101 are horizontal directions.

The semiconductor portion 100 includes a top side cell structure 180 that includes a plurality of field effect transistor cells FTC electrically connected to a source electrode at the front side.

The field effect transistor cells FTC may be planar transistor cells with gate electrodes formed outside of the semiconductor portion 100 in a distance to the first surface 101 or may be trench transistor cells with gate electrodes extending from the first surface 101 into the semiconductor portion 100.

A drain structure 120 separates the top side cell structure 180 from a drain electrode 320 at the back and includes a backside construction 190 directly adjoining a drain electrode 320 and comprising one or more backside pn junctions (pnx). The drain structure 120 includes a contact layer 129 directly adjoining a drain electrode 320 along the second surface 102. A lightly doped drift zone 121 of the drain structure 120 is directly between the contact layer 129 and the top side cell structure 180 and directly adjoins both of them.

The contact layer 129 may include connection portions 129a forming unipolar homojunctions with the drift zone 121 as well as counter-doped portions 129b forming pn junctions with both the drift zone 121 and the connection portions 129a.

In FIG. 4A the connection portions 129a are directly between the drift zone 121 and the drain electrode 320 and directly adjoin both of them. At least along the second surface 102 a dopant concentration in the connection portions 129a may be sufficiently high to form ohmic contacts with the drain electrode 320. The counter-doped portions 129b may also be directly between the drift zone 121 and the drain electrode 320 and directly adjoin both of them as illustrated in FIG. 4A. A dopant concentration in the counter-doped portions 129b is in a range from 1E16 cm$^{-3}$ to 5E18 cm$^{-3}$, for example in a range from 1E16 cm$^{-3}$ to 1E17 cm$^{-3}$.

In a plane parallel to the first and second surfaces 101, 102 the counter-doped portions 129b may form stripes with a longitudinal axis orthogonal to the cross-sectional plane, a grid with the connection portions 129a formed in meshes of the grid or isolated columns separated by a grid-shaped connection portion 129a.

A width of the connection portions 129a may be at least 1 μm, for example, at least 5 μm and at most 200 μm, for example 50 μm. A width of the counter-doped portions 129b may be at least 5 μm, for example in a range from 60 μm to 100 μm. The comparatively large counter-doped islands result in a comparatively high on-state resistance RDSon. Additionally, it may be beneficial to reduce the doping concentration of the n-region so that the ratio of rated breakdown voltage BV to dopant concentration $N_D$ in the connection portions BV:$N_D$ is less than 2E19 V/cm$^3$, for example less than 8E18 V/cm$^3$.

Under low forward bias, the connection portions 129a convey the unipolar transistor current passing the field effect transistor cells FTC. With increasing forward current $I_D$, a voltage drop along the pn junctions pnx increases. Above a cut-in voltage $V_{X1}$ a voltage drop along the pn junction pnx exceeds the set-in voltage $V_{setin}$ of the pn junctions pnx, i.e. the material-specific build-in potential of the pn junctions pnx and a bipolar current through the forward biased pn junctions pnx gradually adds to the unipolar current through the connection portions 129a such that the on-state I/V characteristic of the SiC-IGFET 562 gets steeper above the set-in voltage $V_{setin}$, which is at least 2V, e.g., at least 2.7V at 25° C. for SiC, or 3V at 25° C. for GaN.

Figure 4B:
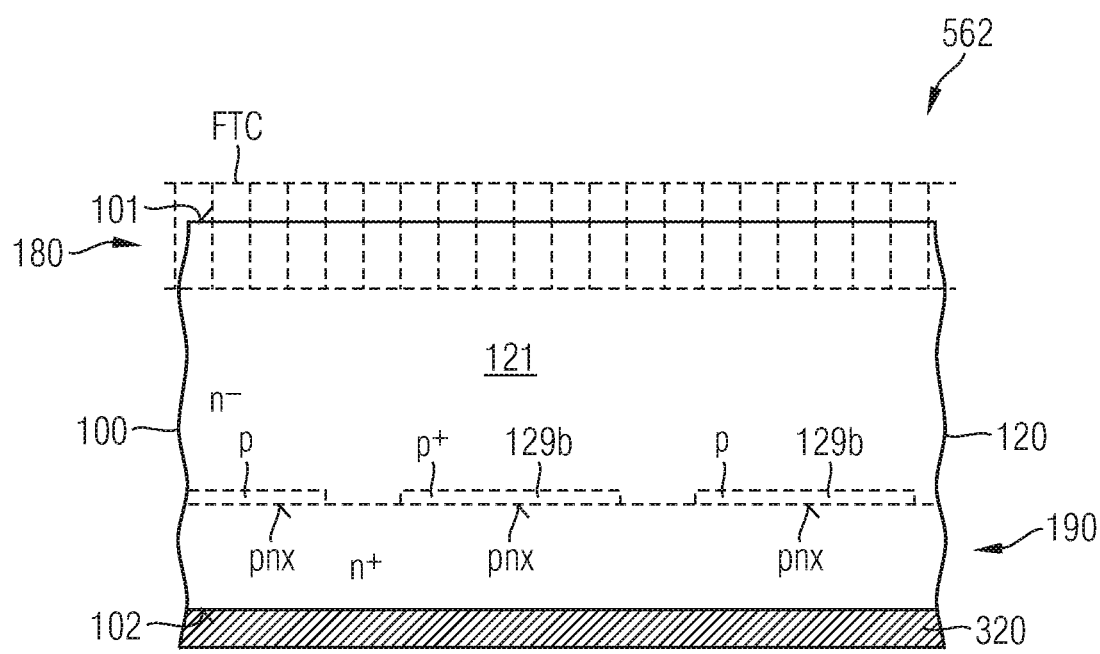
FIG. 4B is a schematic vertical cross-sectional view of a portion of a SiC-IGFET with a bipolar branch based on impact ionization or Zener tunneling according to another embodiment of the wide-bandgap transistor device.

In FIG. 4B one connection portion 129a forms a continuous layer between the drift zone 121 and the drain electrode 320. At least along the second surface 102 a dopant concentration in the connection portion 129a may be sufficiently high to form an ohmic contact with the drain electrode 320. The counter-doped portions 129b may be directly between the drift zone 121 and the continuous layer of the connection portion 129a and directly adjoin both of them. A dopant concentration in the counter-doped portions 129b is in a range from 1E16 cm$^{-3}$ to 5E18 cm$^{-3}$, for example in a range from 1E16 cm$^{-3}$ to 1E17 cm$^{-3}$.

In a plane parallel to the first and second surfaces 101, 102 the counter-doped portions 129b may form stripes with a longitudinal axis orthogonal to the cross-sectional plane, a grid with the connection portions 129a formed in meshes of the grid or isolated columns separated by a grid-shaped connection portion 129a.

A width of the counter-doped portions 129b may be at least 1 µm or at least 10 µm, for example, about 60 µm.

The counter-doped regions 129b inject charge carriers, when the drain-to-source voltage $V_{DS}$ is sufficiently high to trigger impact ionization or Zener tunneling at the pn junction between the counter-doped regions 129b and the second surface 102, similar as is CIBH (Controlled Injection of Backside Holes) diodes.

Figure 4C:
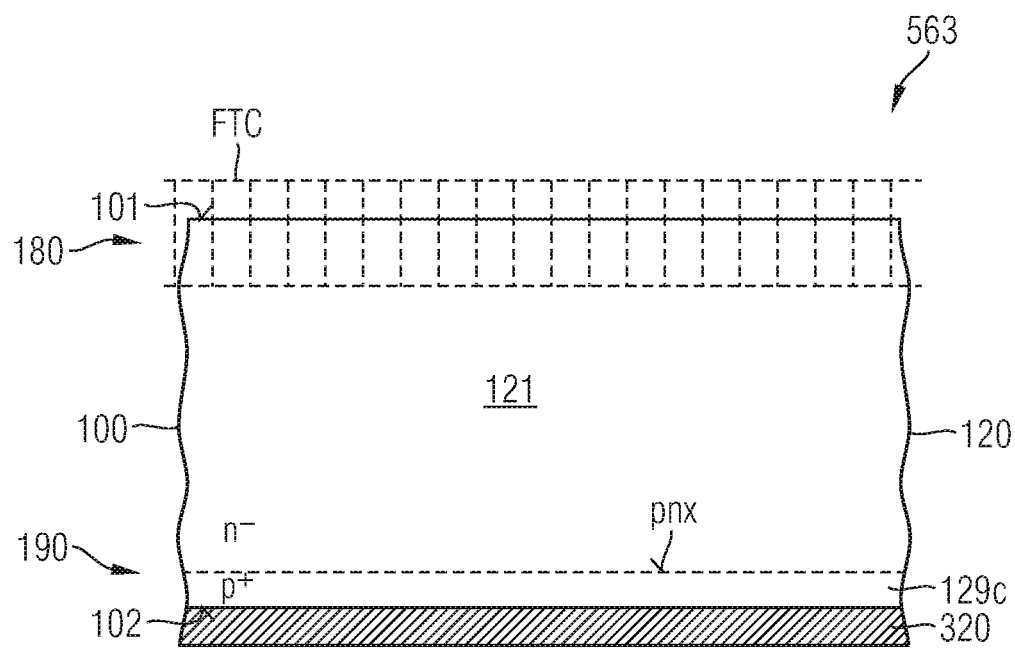
FIG. 4C is a schematic vertical cross-sectional view of a portion of a SiC-IGBT according to a further embodiment of the wide-bandgap transistor device.

In FIG. 4C, the wide-bandgap transistor device 560 is a SiC-IGBT with the counter-doped portions 129c forming a continuous collector layer directly between the drift zone 121 and the drain electrode 320 and directly adjoining both of them.

Figure 4D:
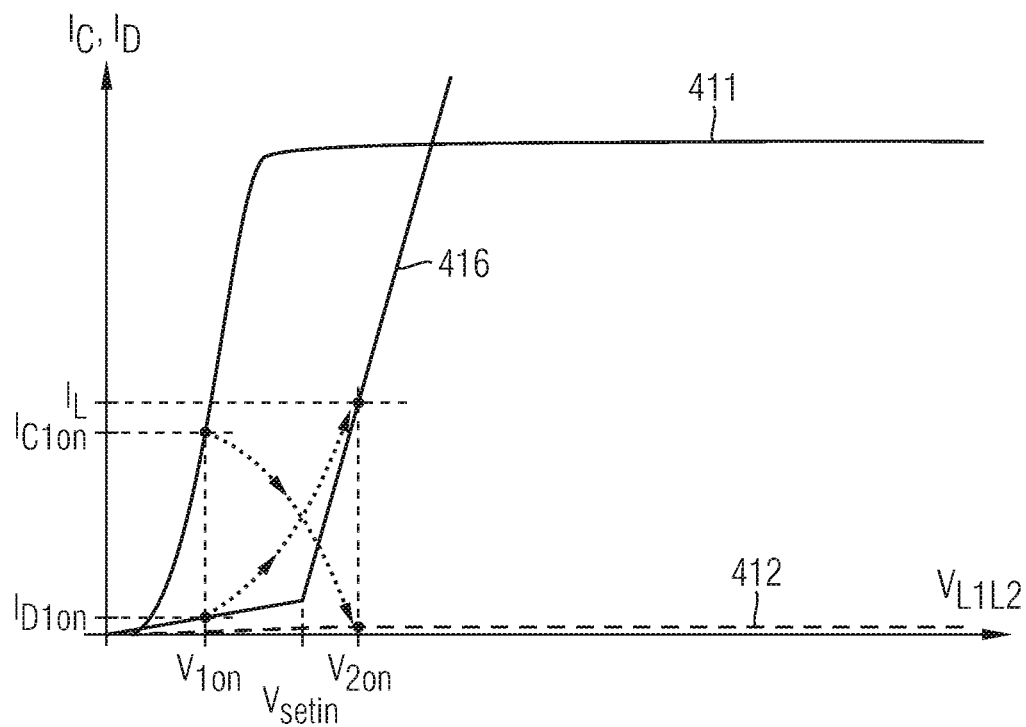
FIG. 4D is a schematic diagram showing forward I/V characteristics of the wide-bandgap transistor devices of FIGS. 4A to 4C.

FIG. 4D schematically shows an on-state I/V characteristic 416 approximating the on-state characteristics of the SiC-IGFETs 562 of FIGS. 4A and 4B and the on-state I/V characteristic of the SiC-IGBT 563 of FIG. 4C. The on-state I/V characteristic 416 includes a shallow, e.g., unipolar branch below a set-in voltage $V_{setin}$ and a steep bipolar branch above the set-in voltage $V_{setin}$. The on-state I/V characteristic of the SiC-IGBT 563 may include only a bipolar branch, wherein the high diffusion voltage shifts on-state I/V characteristic to the right hand side similar as illustrated for the on-state I/V characteristic 416.

Compared to the on-state characteristics of unipolar wide-bandgap transistor device as illustrated in FIG. 1C, the bipolar branch results in a significantly steeper gradient of the on-state I/V characteristic such that the same load current results in a higher voltage drop $V_{2on}$, when the bipolar transistor device is off.

Figure 5A:
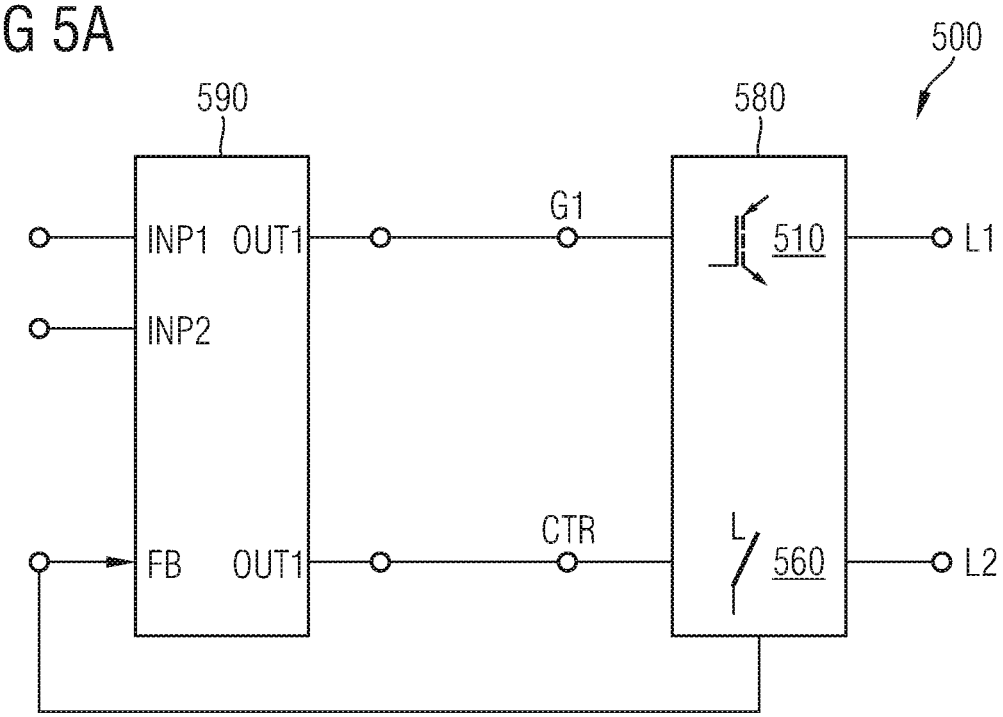
FIG. 5A is a schematic circuit diagram of an electronic assembly according to an embodiment concerning a control circuit with two independent outputs for controlling the bipolar transistor device and the wide-bandgap transistor device.
Figure 5B:
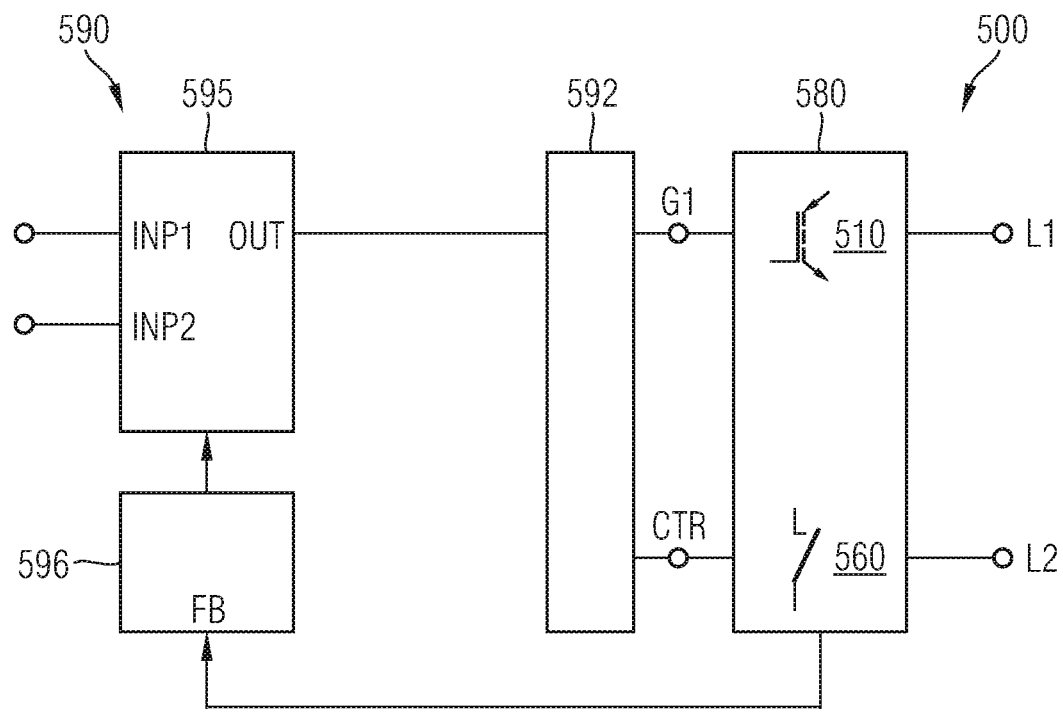
FIG. 5B is a schematic circuit diagram of an electric assembly according to an embodiment concerning a conversion network circuit deriving control signals for the wide-bandgap transistor device and the bipolar transistor device from a common source control signal.

FIGS. 5A and 5B refer to an electric assembly 500 including a control circuit 590 for controlling a parallel connection 580 of a bipolar transistor device 510 and a wide-bandgap transistor device 560 as described above.

In FIG. 5A, a first control output OUT1 of the control circuit 590 is electrically coupled, e.g., electrically connected to the gate terminal G1 of the bipolar transistor device 510. A second control output OUT2 of the control circuit 590 is electrically coupled, e.g., electrically connected to a control terminal CTR of the wide-bandgap transistor device 560. The parallel connection 580 may form or may be part of the low-side switch or of the high-side switch in a half-bridge circuit. The control circuit 590 may include further control outputs for controlling a further electric assembly that forms or that is part of the complementary switch in the half-bridge circuit.

The control circuit 590 generates and outputs a first control signal at the first control output OUT1 and a second control signal at the second control output OUT2. The first and second control signals may be square signals, wherein the level of the first control signal controls the on and off periods of transistor cells of the bipolar transistor device 510 under forward bias and, if the bipolar transistor device 510 is an RC-IGBT, also under reverse bias. For example, a high level of the first control signal close to VCC, e.g., +15 V may turn on the bipolar transistor device 510 and a low level of the first control signal close to VEE, e.g., −15 V may turn off the bipolar transistor device 510 under forward bias.

Under forward bias, the wide-bandgap transistor device 560 is turned on and off with a delay with respect to the turn-on and turn-off of the bipolar transistor device 510. A positive voltage level of the second control signal may be equal to, lower than, or higher than the positive voltage level of the first control signal and a negative voltage level of the second control signal may be equal to, higher than, or lower than the negative voltage level of the first control signal.

In addition, the control circuit 590 may generate and output a desaturation pulse of predefined duration at the first control output OUT1 near the end of a reverse bias in case the bipolar transistor device 510 is an RC-IGBT. The desaturation pulse may be applied to the gate terminal G1 of the bipolar transistor device 510 at a predefined point in time before a bias across the electric assembly 500 changes from reverse to forward. The desaturation pulse turns on gated channels for desaturation, e.g., desaturation transistor cells provided only for desaturation or some or all of transistor cells that control the load current under forward bias.

The length of a desaturation pulse may depend on the switching frequency at which the control circuit 590 turns on and off the bipolar transistor device 510. A safety period between the end of the desaturation pulse and the predicted start of commutation including the change from reverse bias to forward bias may be in the range of 50 ns to 5 µs, e.g., 100 ns to 2 µs for devices with a blocking voltage of 1.2 kV, and in a range up to 10 µs for devices with a blocking voltage of about 6.5 kV.

Also under reverse bias, the second control signal output at the second output terminal OUT2 may control the wide-bandgap transistor device 560 such that during saturation the wide-bandgap transistor device 560 is on and takes the greater portion of the reverse current under low-load conditions and/or under open-circuit conditions such that power conversion efficiency under low-load conditions is improved and power consumption of a stand-by mode is reduced. During desaturation of the reverse-conducting bipolar transistor device 510, the wide-bandgap transistor device 560 may be turned on.

The control circuit 590 may include further input terminals INP1, INP2, . . . that allow a higher control instance, e.g., a processor circuit to control the control circuit 590. One or more feedback terminals FB may receive a signal or signals descriptive for load and/or source conditions such that the control circuit 590 may adjust duty cycle and/or switching frequency of the electric assembly 500 to varying load or source conditions.

In FIG. 5B the control circuit 590 includes a conversion network circuit 592 that derives the first and second control signals from a common source control signal a gate driver circuit 595 outputs at an output terminal OUT. The gate driver circuit 595 includes only one output OUT per parallel connection 580 of a bipolar transistor device 510 and a wide-bandgap transistor device 560 and may include two outputs for controlling two of the parallel connections 580 of a bipolar transistor device 510 and a wide-bandgap transistor device 560 of a complete half bridge.

A short-circuit detection circuit 596 is electrically connected to the parallel connection 580 of the bipolar transistor device 510 and the wide-bandgap transistor device 560, generates a short-circuit detection signal in case a short-circuit condition is detected and forwards the short-circuit detection signal to the gate driver circuit 595. In response to the short-circuit detection signal the gate driver circuit 595 may immediately turn off the bipolar transistor device 510 before the wide-bandgap transistor device 560 turns on.

The gate driver circuit 595, the conversion network circuit 592 and the short-circuit detection circuit 596 may be separated entities or at least two of them may be integrated in the same housing and/or on the same semiconductor die.

Figure 6A:
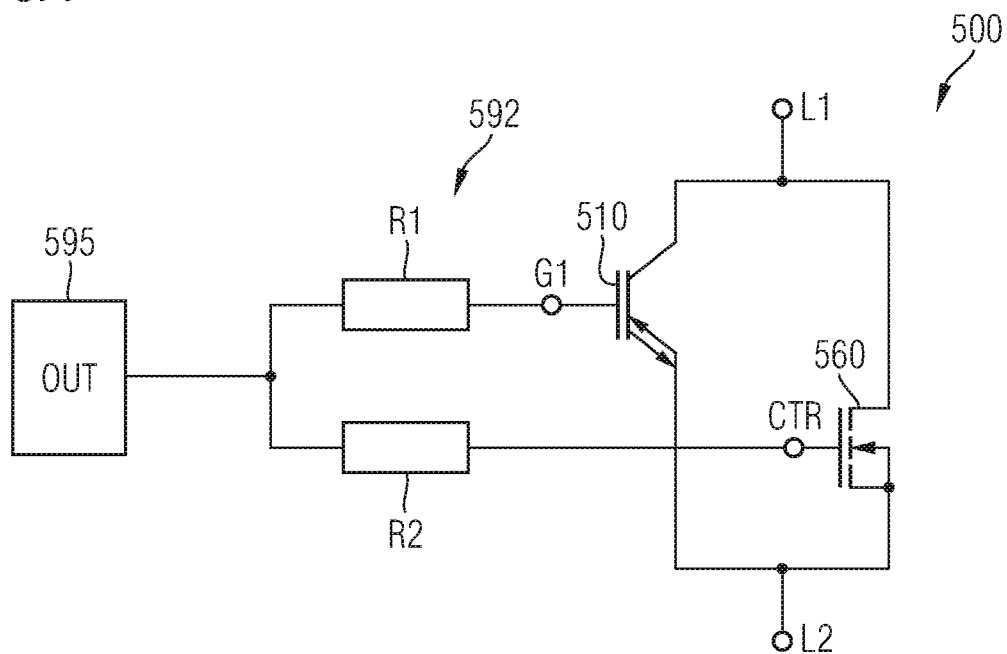
FIG. 6A is a schematic circuit diagram of a conversion network circuit according to an embodiment based on resistors.
Figure 6B:
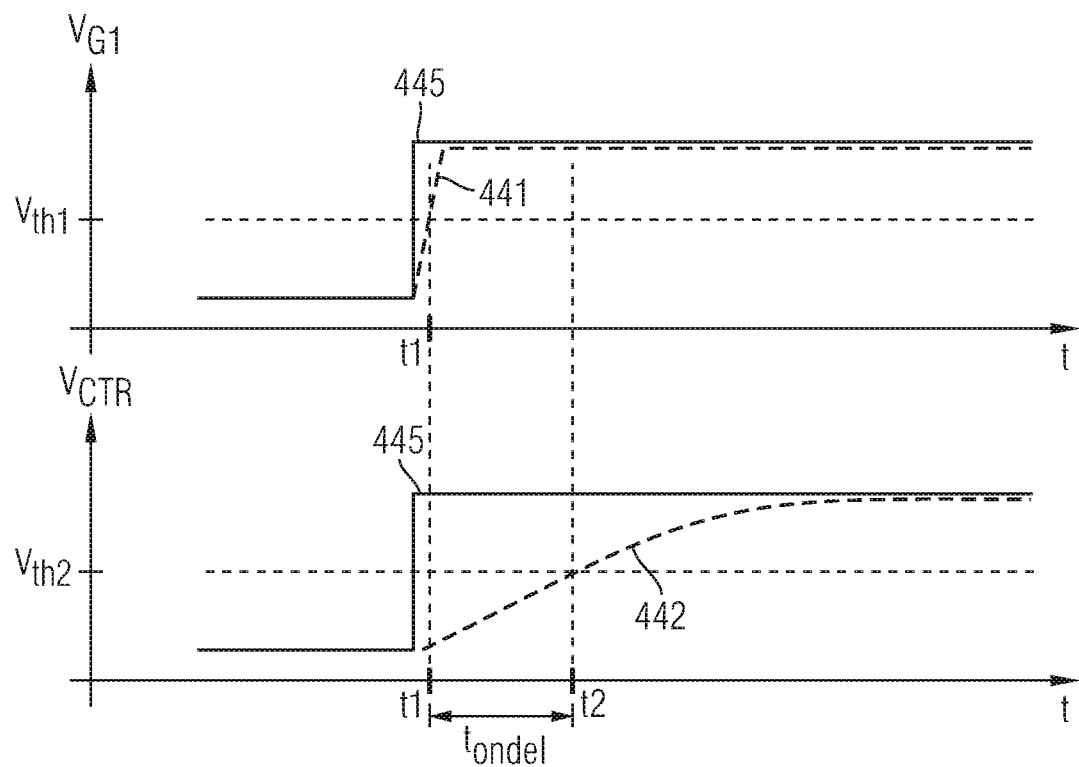
FIG. 6B is a time chart schematically illustrating first and second control signals derived by the conversion network circuit of FIG. 6A from the same common source control signal.

FIGS. 6A and 6B refer to an embodiment of a conversion network circuit 592 deriving the first and second control signals from a common source control signal.

The conversion network circuit 592 may include a first resistor R1 between an output of a gate driver circuit 595 and the gate terminal G1 of the bipolar transistor device 510 as well as a second resistor R2 electrically connected between the output terminal OUT and the control terminal CRT of the wide-bandgap transistor device 560. The resistors R1, R2 in combination with parasitic conductor or device capacitances, e.g., gate-to-source capacitance $C_{gs}$, gate-to-emitter capacitance $C_{ge}$ or gate input capacitance $C_{ies}$, $C_{iss}$ and/or in combination with further capacitive elements form a delay circuit that adjusts the rising edges and the trailing edges of the first and second control signal with respect to each other and that determines the turn-on delay $t_{ondel}$ as well as the turn-off delay $t_{offdel}$ as described above. For example, R2 may be greater than R1 and the effective conductor capacitances are approximately equal such that a time constant for the second control signal is greater than for the first control signal.

FIG. 6B shows the resulting leading edges of the common source control signal 445, of the first control signal 441 applied to the gate terminal G1 of the bipolar switching device 510 and of the second control signal 442 applied to the control terminal CTR of the wide-bandgap transistor device 560. The greater time constant effective for the second control signal delays the leading edge of the second control signal with respect to the leading edge of the first control signal. The resulting turn-on delay $t_{ondel}$ further depends on the respective threshold voltages $V_{th1}$ of the bipolar transistor device 510 and $V_{th2}$ of the wide-bandgap transistor device 560.

FIGS. 7A to 7D refer to further embodiments with control circuits 590 adapted to specific embodiments of the bipolar transistor device 510 and the wide-bandgap transistor device 560.

Figure 7A:
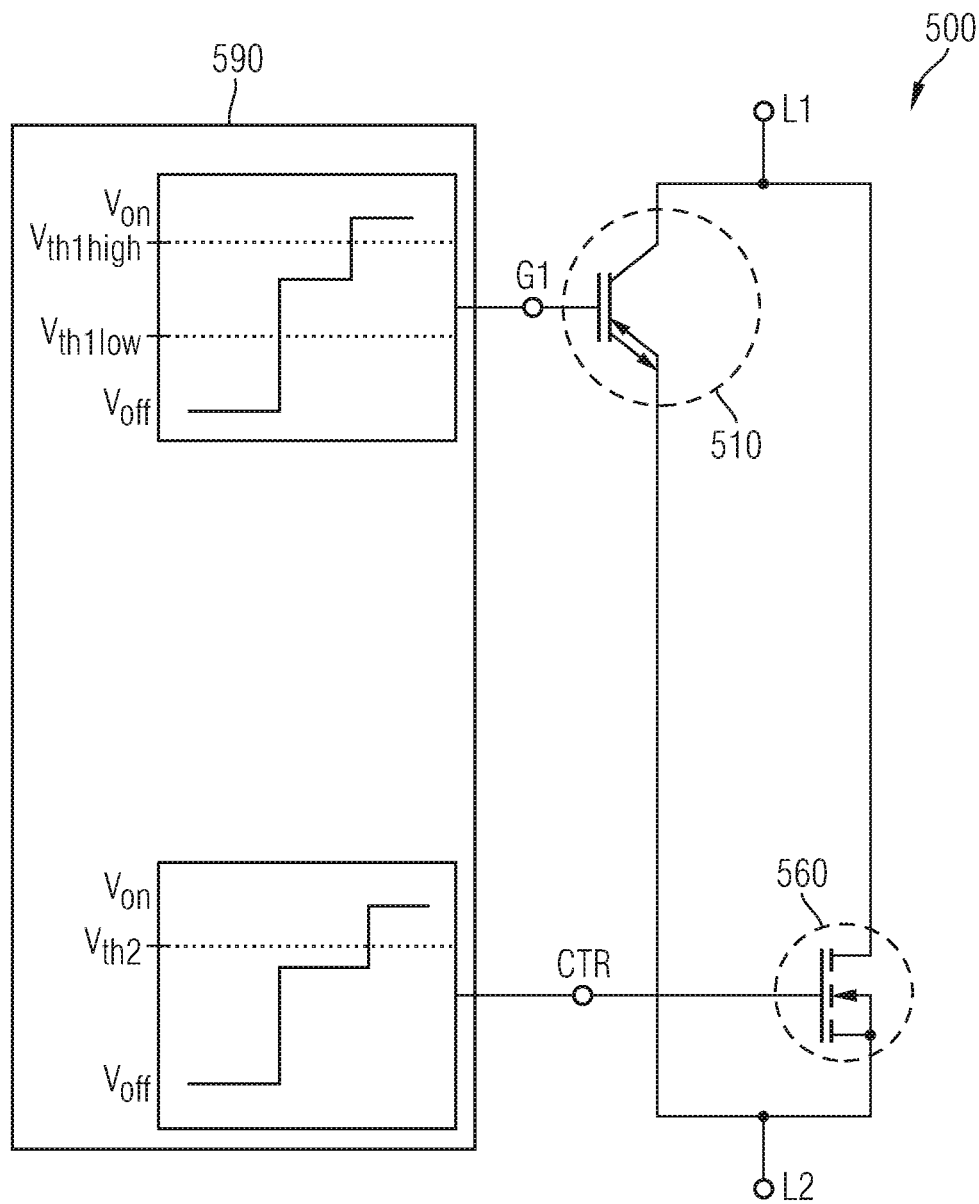
FIG. 7A is a schematic circuit diagram of an electric assembly according to an embodiment concerning multi-level control signals.

In FIG. 7A the bipolar transistor device 510 is a dual-on-level device including first transistor cells with a low first threshold voltage $V_{th1low}$ and second transistor cells with a high first threshold voltage $V_{th1high} > V_{th1low}$. During the turn-on delay $t_{ondel}$ the control circuit 590 outputs a first control signal that turns on only the first transistor cells. The second control signal basically follows the first control signal but during the turn-on delay $t_{ondel}$ does not reach the second threshold voltage $V_{th2}$ of the wide-bandgap transistor device 560 such that the wide-bandgap transistor device 560 turns on only contemporaneously with or later than the second transistor cells of the bipolar transistor device 510.

Figure 7B:
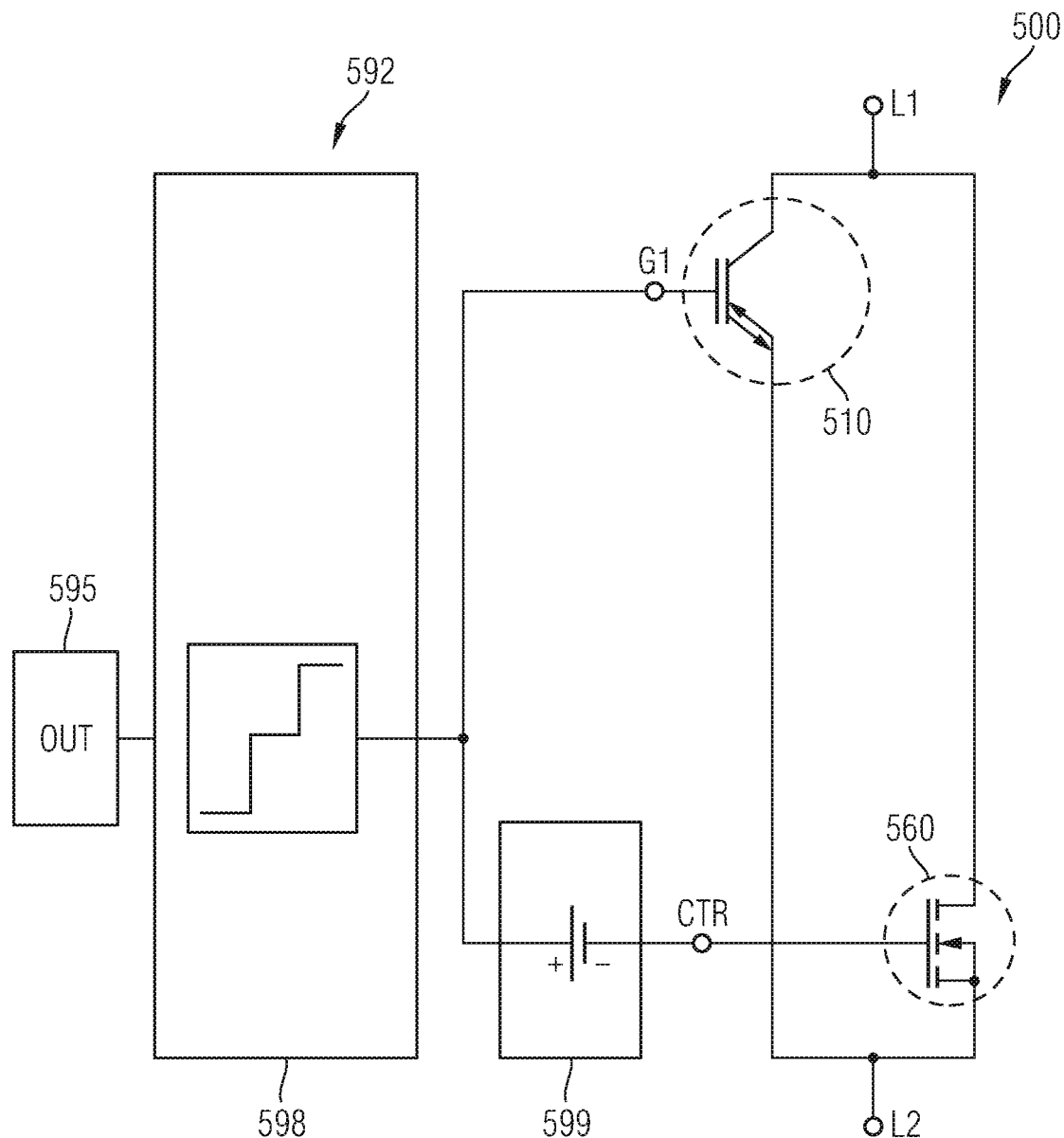
FIG. 7B is a schematic circuit diagram of an electric assembly according to an embodiment concerning a conversion network circuit providing multi-level control signals.

In FIG. 7B the control circuit 590 includes a level shifter stage 598 that generates, from a dual-on-level source control signal, a multi-level signal adapted to control the dual-on-level bipolar transistor device 510 and a voltage shifter 599 that differentiates the output signal of the level shifter stage 598 such that the bipolar transistor device 510 partly turns on while the wide-bandgap transistor device 560 is still off.

The voltage shifter 599 may be connected between the level shifter stage 598 and the bipolar transistor device 510 or between the driver stage 598 and the wide-bandgap transistor device 560 and may include, e.g., a constant voltage source, a further driver circuit, or both.

Figure 7C:
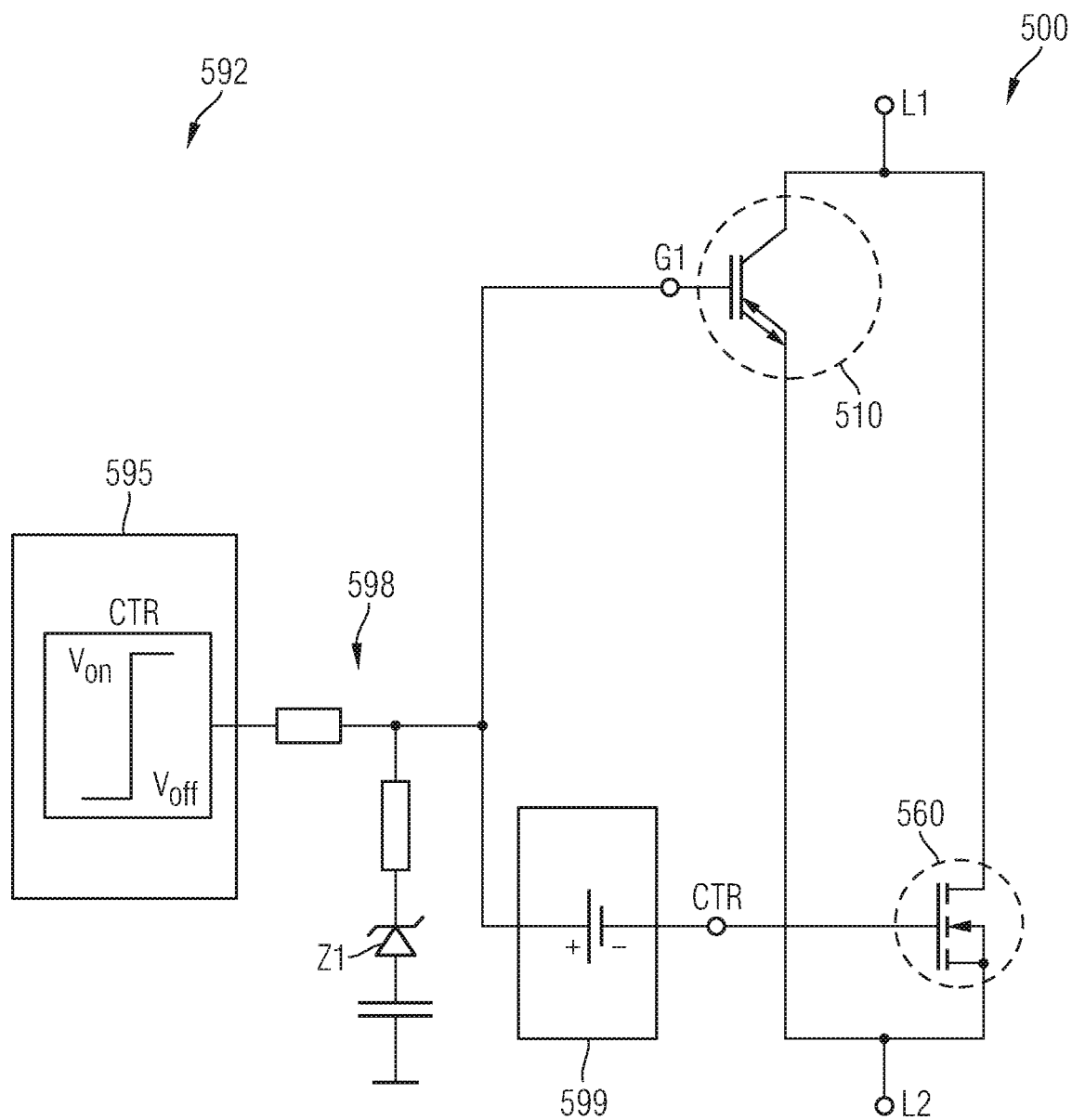
FIG. 7C is a schematic circuit diagram of an electric assembly according to another embodiment concerning a common control signal.

FIG. 7C shows an electric assembly 500 with a level shifter stage 598 that includes a Zener diode Z1 electrically connected in parallel with the parallel connection of a bipolar transistor device 510 and a wide-bandgap transistor device 560. The electric assembly 500 further includes a voltage shifter 599 electrically connected between an output of the level shifter stage 598 and the control terminal CTR of the wide-bandgap transistor device 560.

Figure 7D:
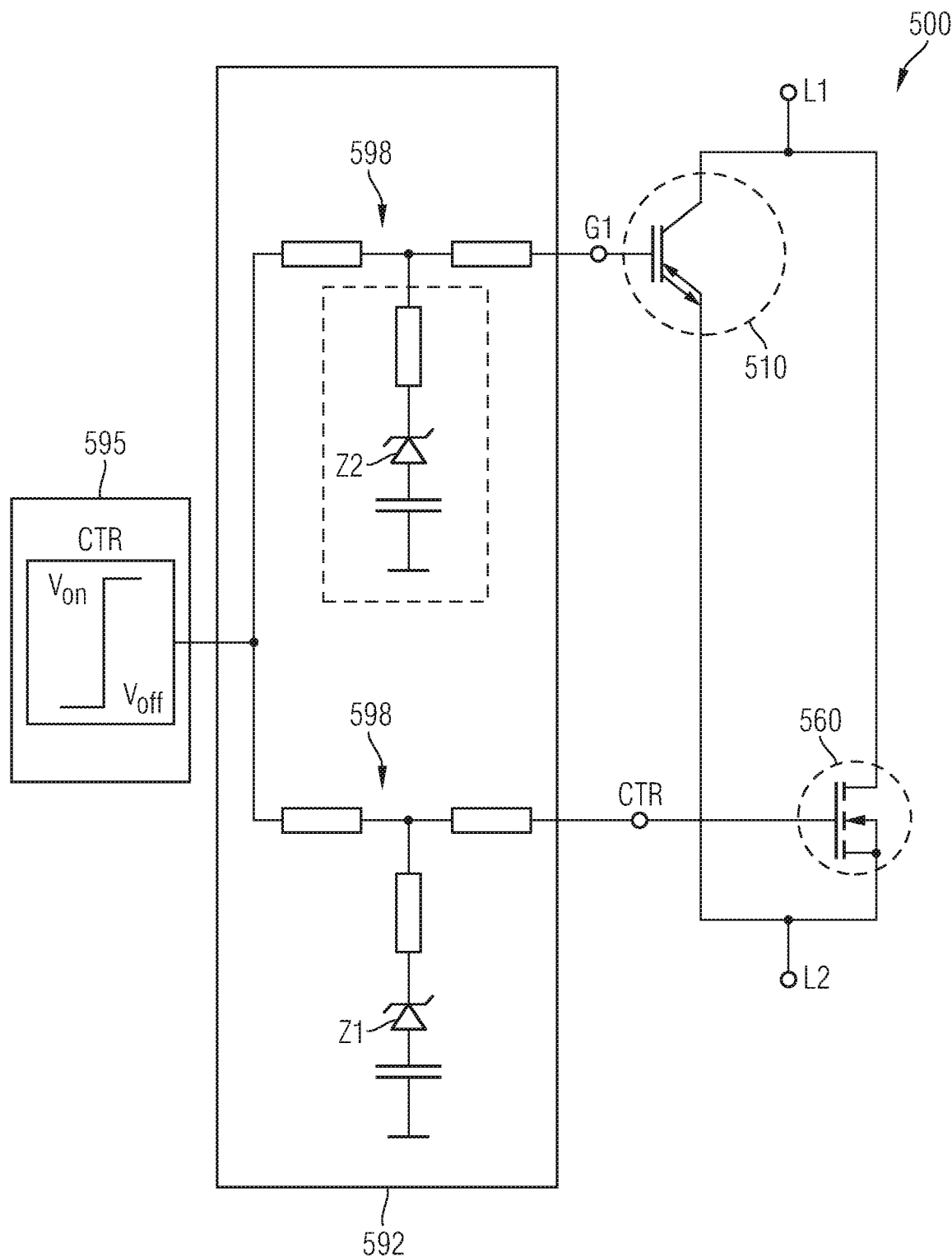
FIG. 7D is a schematic circuit diagram of an electric assembly according to an embodiment concerning a further conversion network circuit deriving the control signals for the bipolar transistor device and the wide-bandgap transistor device from a common source control signal.

In FIG. 7D an electric assembly 500 includes two level shifter stages 598 including Zener diodes Z1, Z2 one of them electrically connected between an output of a gate driver circuit 595 and the gate terminal G1 of the bipolar transistor device 510 and the other one electrically connected between the output of the gate driver circuit 595 and the control terminal CTR of the wide-bandgap transistor device 560.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electric assembly, comprising:
   an insulated gate bipolar transistor device;
   a wide-bandgap transistor device electrically connected in parallel with the bipolar transistor device to form a parallel circuit between first and second load terminals of the electric assembly; and
   a control circuit electrically coupled to a gate terminal of the bipolar transistor device and to a control terminal of the wide-bandgap transistor device, wherein the control circuit is configured to turn on the bipolar transistor device and to turn on the wide-bandgap transistor device at a predefined turn-on delay with respect to a turn-on of the bipolar transistor device so that during the turn-on delay only the bipolar transistor device is on and after the turn-on delay both the bipolar transistor device and the wide-bandgap transistor device are on.

2. The electric assembly of claim 1, wherein the control circuit is configured to turn off the bipolar transistor device and to turn off the wide-bandgap transistor device at a predefined turn-off delay with respect to a turn-off of the bipolar transistor device.

3. The electric assembly of claim 1, wherein the control circuit is configured to selectively turn on desaturation transistor cells of the bipolar transistor device under reverse bias of the bipolar transistor device.

4. The electric assembly of claim 1, wherein the control circuit is configured to turn on desaturation transistor cells of the bipolar transistor device and the wide-bandgap transistor device under reverse bias of the bipolar transistor device.

5. The electric assembly of claim 1, wherein a semiconductor portion of the wide-bandgap transistor device comprises a wide-bandgap semiconductor material with a bandgap of at least 2.0 eV.

6. The electric assembly of claim 1, wherein a semiconductor portion of the wide-bandgap transistor device comprises silicon carbide.

7. The electric assembly of claim 1, further comprising:
an overcurrent detection circuit configured to detect an overload condition of the bipolar transistor device and to generate an overload detection signal indicating the overload condition, wherein
the control circuit is configured to turn off the bipolar transistor device in response to the overload detection signal.

8. The electric assembly of claim 1, wherein a nominal turn-on current of the wide-bandgap transistor device is at least 10% of the nominal turn-on current of the bipolar transistor device.

9. The electric assembly of claim 1, wherein the control circuit is configured to generate a desaturation signal and to output the desaturation signal to the bipolar transistor device at a point in time preceding a change of a voltage bias across the first and second load terminals of the electric assembly from reverse to forward.

10. The electric assembly of claim 1, wherein the control circuit comprises a first output terminal electrically coupled to the gate terminal of the bipolar transistor device and a second output terminal electrically coupled to the control terminal of the wide-bandgap transistor device.

11. The electric assembly of claim 1, wherein the wide-bandgap transistor device comprises a plurality of field effect transistor cells electrically connected in parallel.

12. The electric assembly of claim 11, wherein the wide-bandgap transistor device comprises counter-doped portions forming pn junctions with a drift zone and one or more connection portions that directly adjoin the drift zone and a drain electrode.

13. The electric assembly of claim 12, wherein the one or more connection portions are arranged between the drift zone and the drain electrode, and wherein the counter-doped portions are configured to inject charge carriers into at least one of the drift zone and the one or more connection portions above a set-in voltage of at least 2V and at most 3.5V at 25° C.

14. The electric assembly of claim 12, wherein the counter-doped portions are arranged between the drift zone and a continuous connection portion and are configured to trigger impact ionization or Zener tunneling of charge carriers into the one or more connection portions.

15. The electric assembly of claim 11, wherein the wide-bandgap transistor device comprises a collector layer forming a backside pn junction with the drift zone.

16. The electric assembly of claim 1, wherein the control circuit is configured to output a second control signal for turning on the wide-bandgap transistor device and which changes from an off-level control voltage to an on-level control voltage not before 80% of an on-state period has passed, in which a first control signal output by the control circuit for turning on the bipolar transistor device has an on-level gate voltage.

17. The electric assembly of claim 1, wherein the control circuit is configured to output a second control signal for turning on the wide-bandgap transistor device and which rises to an on-level control voltage within less than 6 μs after a first control signal output by the control circuit for turning on the bipolar transistor device falls to an off-level gate voltage.

18. An electric assembly, comprising:
an insulated gate bipolar transistor device;
a wide-bandgap transistor device electrically connected in parallel with the bipolar transistor device to form a parallel circuit between first and second load terminals of the electric assembly, the wide-bandgap transistor device comprising a plurality of field effect transistor cells electrically connected in parallel; and
a backside construction directly adjoining a drain electrode and comprising one or more backside pn junctions.

19. The electric assembly of claim 18, wherein the wide-bandgap transistor device is configured to conduct, in an on-state, a unipolar current below a set-in voltage and a bipolar current above the set-in voltage, and wherein the set-in voltage is defined by parameters of the one or more backside pn junctions.

20. The electric assembly of claim 18, wherein the wide-bandgap transistor device comprises a drift zone and a plurality of counter-doped portions forming the backside pn junctions with at least one of the drift zone and with connection portions arranged between the drift zone and the drain electrode, and wherein the counter-doped portions are configured to inject charge carriers into at least one of the drift zone and the connection portions above a set-in voltage of at least 2V and at most 3.5V at 25° C.

21. The electric assembly of claim 18, wherein the wide-bandgap transistor device comprises a drift zone and a plurality of counter-doped portions forming the backside pn junctions with a continuous connection portion that is arranged between the counter-doped portions and the drain electrode, and wherein the counter-doped portions are configured to trigger at least one of impact ionization and Zener tunneling of charge carriers in the connection portion.

22. The electric assembly of claim 18, wherein the wide-bandgap transistor device comprises a collector layer directly adjoining the drain electrode and forming the backside pn junction with the drift zone.

23. An electric assembly, comprising:
a reverse conducting insulated gate bipolar transistor device comprising desaturation transistor cells;
a wide-bandgap transistor device electrically connected in parallel with the bipolar transistor device to form a parallel circuit between first and second load terminals of the electric assembly; and
a control circuit electrically coupled to a gate terminal of the bipolar transistor device and to a control terminal of the wide-bandgap transistor device,
wherein the control circuit is configured to turn on the desaturation transistor cells under reverse bias of the bipolar transistor device and to turn on both the bipolar transistor device and the wide-bandgap transistor device under forward bias of the bipolar transistor device.

24. The electric assembly of claim 23, wherein the control circuit is configured to turn on the bipolar transistor device and to turn on the wide-bandgap transistor device at a predefined turn-on delay with respect to a turn-on of the bipolar transistor device.

25. The electric assembly of claim 23, wherein the control circuit is configured to turn off the bipolar transistor device and to turn off the wide-bandgap transistor device at a predefined turn-off delay with respect to a turn-off of the bipolar transistor device.

26. The electric assembly of claim 23, wherein the wide-bandgap transistor device comprises counter-doped portions forming pn junctions with a drift zone and one or more connection portions that directly adjoin the drift zone and a drain electrode.

27. The electric assembly of claim 1, wherein a maximum rating short circuit current of the wide-bandgap transistor device is at least a nominal collector current of the bipolar transistor device.

28. The electric assembly of claim 27, wherein the maximum rating short circuit current of the wide-bandgap transistor device is at least three times the nominal collector current of the bipolar transistor device.

* * * * *